United States Patent [19]
Koike

[11] Patent Number: 6,011,436
[45] Date of Patent: Jan. 4, 2000

[54] VOLTAGE CONVERSION CIRCUIT AND DIFFERENTIAL DIFFERENCE AMPLIFIER

[75] Inventor: Hideharu Koike, Kawasaki, Japan

[73] Assignee: Kabushiki Kaisha Toshiba, Kawasaki, Japan

[21] Appl. No.: 08/971,730

[22] Filed: Nov. 17, 1997

[30] Foreign Application Priority Data

Nov. 18, 1996 [JP] Japan ................................. 8-306900

[51] Int. Cl.[7] ...................................................... H03F 3/45
[52] U.S. Cl. .......................................... 330/253; 330/301
[58] Field of Search .................................. 330/253, 254, 330/259, 260, 301, 69, 150, 310

[56] References Cited

U.S. PATENT DOCUMENTS

| | | | |
|---|---|---|---|
| 4,588,956 | 5/1986 | de Corlieu et al. ................. | 330/310 X |
| 4,716,380 | 12/1987 | Proebsting ............................. | 330/253 |
| 5,530,403 | 6/1996 | Bushman et al. ...................... | 330/253 |
| 5,650,753 | 7/1997 | Ling ........................................ | 330/253 |

OTHER PUBLICATIONS

Eduard Saeckinger, et al., IEEE Journal of Solid–State Circuits, vol. SC–22, No. 2, pp. 287–294, "A Versatile Building Block: The CMOS Differential Difference Amplifier", Apr. 1987.

Shu–Chuan Huang, et al., IEEE Transactions on Circuits and Systems–II, vol. 40, No. 5, pp. 289–301, "A Wide Range Differntial Difference Amplifer: A Basic Block for Signal Processing in MOS Technology", May 1993.

*Primary Examiner*—Steven J. Mottola
*Attorney, Agent, or Firm*—Oblon, Spivak, McClelland, Maier & Neustadt, P.C.

[57] ABSTRACT

Two pairs of differential input voltages are converted into two pairs of differential voltages through voltage converters whose output voltages are determined only by the input voltage amplitudes. Of the two pairs of differential input voltages, a voltage across the positive terminals and a voltage across the negative terminals of the voltage converters are converted into two pairs of differential currents through voltage-to-current converters. An output voltage proportional to the difference between the two pairs of differential currents is obtained with improved linearity through a current-to-voltage converter.

9 Claims, 15 Drawing Sheets

VOLTAGE CONVERSION CIRCUIT AND DIFFERENTIAL DIFFERENCE AMPLIFIER

BACKGROUND OF THE INVENTION

The present invention relates to a voltage conversion circuit and a differential difference amplifier (DDA) containing a voltage conversion circuit and, more particularly, to a voltage conversion circuit and differential difference amplifier suitable for a CMOS integrated circuit using a CMOS circuit.

A DDA is an amplifier for outputting a voltage proportional to the difference between two differential input voltages. A conventional instrumentation amplifier has an arrangement shown in FIG. 20.

The operation principle of this circuit will be described below. An input voltage $\Delta VA$ $(=VA1-VA2)$ is input across input terminals A1 and A2, and an output voltage $\Delta VOUT$ $(=(1+2R1/R2)\Delta VA)$ proportional to the differential input voltage is generated across output terminals OUT1 and OUT2. In this case, R31=R32=R33=R34. In this circuit, however, when the input voltage range is narrow, and the resistance values of four resistors R31, R32, R33, and R34 vary, the center value of the output voltage varies in accordance with variations in center value of the input voltage.

The first problem with this circuit is that the variation range of the center value of the input voltage is limited. When R1/R2 is 100 or more, the voltage across nodes N3 and N4 becomes 200 times the input voltage or more. The nodes N3 and N4 vary in accordance with the variation in center value of the input voltage. Therefore, the voltage range of the nodes N3 and N4 is obtained by adding the variation range ($\Delta VAcen$) of the center value of the input voltage to a voltage obtained by multiplying a maximum value $\Delta VA(max)$ of the input signal amplitude by an amplification factor.

More specifically, $$\Delta VAcen + \left(1 + \frac{2R1}{R2}\right)\Delta VA(max) \le VDD \quad (1)$$

Therefore, $$\Delta VAcen \le VDD - \left(1 + \frac{2R1}{R2}\right)\Delta VA(max) \quad (2)$$

The variation range of the center value of the input voltage is limited.

The second problem is that the output voltage $\Delta VOUT$ varies in accordance with the center value of the input voltage. For a differential amplifier X3 to properly operate, R31=R33 and R32=F34 must hold. When the resistance values of R31, R32, R33, and R34 vary, the following equation (3) holds:

$$\Delta VOUT = K\Delta VIN + L(V4-VOUT2) \quad (3)$$

for $$K = -\left(1 + \frac{2R1}{R2}\right)\frac{R32}{R31} \quad (4)$$

$$L = \left(\frac{R34}{R33} - \frac{R32}{R31}\right) \Big/ \left(1 + \frac{R34}{R33}\right) \quad (5)$$

As is apparent from equation (3), even when the input amplitude is zero, the output voltage amplitude varies in accordance with the input voltage.

To solve these problems, the output voltage must be divided and directly compared with the input voltage. To realize this arrangement, the DDA may be used as an instrumentation amplifier for an instrument. The DDA is represented by a symbol shown in FIG. 21, and its input/output relationship is given by:

$$(VOUT1-VOUT2) = A\{(VA1-VA2)-(VB1=VB2)\} \quad (6)$$

where A is the amplification factor of the DDA.

FIG. 22 shows the arrangement of an instrumentation amplifier using a DDA.

In the example shown in FIG. 22, the input voltage $\Delta VA$ is input across the terminals A1 and A2, and the terminal voltage at R2 is negatively fed back such that the terminal voltage equals $\Delta VA$. Therefore, a voltage $-(2R1/R2+1)\Delta VA$ is output across the terminals VOUT1 and VOUT2. Even when the center voltage of the input voltage varies, the output voltage does not change. For this reason, the input voltage range is wide. In addition, variations in resistors R1 and R2 only change the amplification factor. When the input voltage amplitude is zero, the output voltage amplitude is also zero.

The circuit arrangement of the DDA is described in detail in the following references [1] and [2]. However, both circuits have problems to be described below.

[1] Eduard Sackinger et al., "A Versatile Building Block—The CMOS Differential Difference Amplifier", IEEE, JSSC, Vol. SC-22, No. 2, April 1987, pp. 287–294.

[2] Shu-Chuang et al., "A Wide Range Differential Difference Amplifier. A Basic Block for Analog Signal Processing in MOS Technology", IEEE, Trans. on Circuits and Systems—II: Vol. 40, No. 5, May 1993, pp. 289–301.

FIG. 23 shows the circuit described in reference [1].

Two differential input voltages A1 and A2 are received by two pairs of differential transistors M201 and M202, and M203 and M204, respectively, which have matched characteristics, and are converted into currents. The current difference is calculated by subtraction; the difference between the two differential input voltages is converted into a current difference.

A current difference $\Delta I$ is given by:

$$\Delta I = I1 - I2 \quad (7)$$

$$= Kn\Delta VA\sqrt{\frac{2Is}{Kn} - (\Delta VA)^2} - Kn\Delta VB\sqrt{\frac{2Is}{Kn} - (\Delta VB)^2}$$

for $\Delta VA = VA1 - VA2$ $\Delta VB = VB1 - VB2$ $$Kn = \frac{\mu \text{Cox}}{2} \frac{W}{L}$$

where $\mu$ is the mobility of the MOS transistor, Cox is the capacitance per unit area of the gate oxide film, and W and L are the gate width and gate length of the transistor, respectively.

As is apparent from equation (7), the output current $\Delta I$ is not proportional to the difference between the differential input voltages $\Delta VA$ and $\Delta VB$. However, when the differential input voltages $\Delta VA$ and $\Delta VB$ have very small values, equation (8) below holds:

$$\Delta I = \sqrt{2IsKn}\,(\Delta VA - \Delta VB) \tag{8}$$

When the amplitude of the differential input voltage is small, the circuit shown in FIG. 23 operates as a DDA. However, as the amplitude of the differential input voltage becomes larger, the linearity between the difference between the two differential input voltages and the output current is lost. This further decreases the gain, so the circuit ceases to function as a DDA.

FIG. 24 shows the circuit described in reference [2].

The output current ($\Delta I=I1-I2$) corresponding to the differential input voltage $\Delta VA$ is given by:

$$\Delta I = I1 - I2 \tag{9}$$

$$= \Delta VA \cdot 4Kp\sqrt{\frac{Kd}{Ku}} \cdot \left[(VC - VDD + 2Vthn + Vthp) + \sqrt{\frac{Kd}{Ku}}\sqrt{\frac{2Is}{Kd} - (\Delta VA)^2}\right]$$

where Kd is the current coefficient of M1 to M4, and Ku is the current coefficient of M5 to M8.

As can be seen from equation (9), even in the circuit shown in FIG. 24, the input voltage and the output voltage still have nonlinearity. This nonlinearity can be suppressed to some extent by minimizing Kd/Ku. However, the circuit shown in FIG. 24 has another problem that the circuit is influenced by the substrate bias effect. When the source of the transistor is connected to the substrate, the substrate bias effect can be suppressed although this poses a new problem of limitation on design and process.

As described above, in the conventional DDA, as the amplitude of the differential input voltage becomes large, linearity between the difference between two differential input voltages and the output current is lost, and the circuit is influenced by the substrate bias effect.

SUMMARY OF THE INVENTION

It is an object of the present invention to provide a voltage conversion circuit and DDA which have excellent linearity and can minimize variations in characteristics due to the substrate bias effect.

According to the present invention, there is provided a differential difference amplifier for outputting a voltage corresponding to a difference between two pairs of differential input voltages, comprising first and second voltage conversion circuits having substantially the same characteristics to receive differential voltages and output differential voltages determined by amplitudes of the received differential voltages, the first voltage conversion circuit receiving first differential input voltages and outputting first differential output voltages, and the second voltage conversion circuit receiving second differential input voltages and outputting second differential output voltages, first and second voltage-to-current conversion circuits having substantially the same characteristics to receive the differential voltages and outputting differential currents corresponding to amplitudes of the differential voltages, the first voltage-to-current conversion circuit receiving positive-side voltages of the first differential output voltages output from the first voltage conversion circuit and the second differential output voltages output from the second voltage conversion circuit and outputting first differential output currents, and the second voltage-to-current conversion circuit receiving negative-side voltages of the first differential output voltages output from the first voltage conversion circuit and the second differential output voltages output from the second voltage conversion circuit and outputting second differential output currents, and a current-to-voltage conversion circuit for receiving differential currents and outputting a voltage corresponding to a difference between the differential currents, the current-to-voltage conversion circuit having one input terminal connected to a positive output terminal of the first voltage-to-current conversion circuit and a negative output terminal of the second voltage-to-current conversion circuit and the other input terminal connected to a negative output terminal of the first voltage-to-current conversion circuit and a positive output terminal of the second voltage-to-current conversion circuit, receiving a synthesized output current of the first differential output current and the second differential output current, and outputting a voltage corresponding to the synthesized output current.

According to the present invention, there is also provided a differential difference amplifier for outputting a voltage corresponding to a difference between two pairs of differential input voltages, comprising first and second voltage conversion circuits having substantially the same characteristics to receive differential input voltages and output a single output voltage corresponding to amplitudes of the differential voltages, the first voltage conversion circuit receiving first differential input voltages and outputting a first single output voltage, and the second voltage conversion circuit receiving second differential input voltages and outputting a second single output voltage, and a voltage amplifier for amplifying received differential input voltages and outputting differential output voltages or a single output voltage, the voltage amplifier receiving voltages across output terminals of the first and second voltage conversion circuits as the differential input voltages, amplifying the differential input voltages, and outputting output voltages.

According to the present invention, there is provided a voltage conversion circuit comprising, e.g., first and second MOS transistors of a first conductivity type which have sources commonly connected and grounded through a constant current source and substantially the same characteristics, a third MOS transistor of a second conductivity type which has a drain and gate connected to a drain of the first MOS transistor and a source connected to a power supply terminal, a fourth MOS transistor of the second conductivity type which has a drain and gate connected to a drain of the second MOS transistor, a source connected to the power supply terminal, and substantially the same characteristics as those of the third MOS transistor, a fifth MOS transistor of the first conductivity type which has a source connected to a reference power supply terminal and a gate connected to a drain thereof, a sixth MOS transistor of the first conductivity type which has a source connected to the reference power supply terminal, a gate connected to a drain thereof, and substantially the same characteristics as those of the fifth MOS transistor, a seventh MOS transistor of the second conductivity type which has a source connected to a power supply terminal, a drain connected to the drain of the fifth MOS transistor, and a gate connected to the gate of the third MOS transistor, and an eighth MOS transistor of the second conductivity type which has a source connected to the power supply terminal, a drain connected to the drain of the sixth MOS transistor, a gate connected to the gate of the fourth MOS transistor, and substantially the same characteristics as those of the seventh MOS transistor, wherein differential input voltages are applied to the gates of the first and second MOS transistors and differential voltages are output from the drains of the fifth and sixth MOS transistors.

According to the DDA of the present invention, a current corresponding to the difference between negative-side input voltages of the first and second differential input voltages is subtracted from a current corresponding to the difference between positive-side input voltages of the first and second differential input voltages. With this arrangement, linearity can be improved, and the influence of characteristic variations due to the substrate bias effect can be minimized.

DESCRIPTION OF THE PREFERRED EMBODIMENTS

An embodiment of the present invention will be described below with reference to the accompanying drawings.

Figure 1:
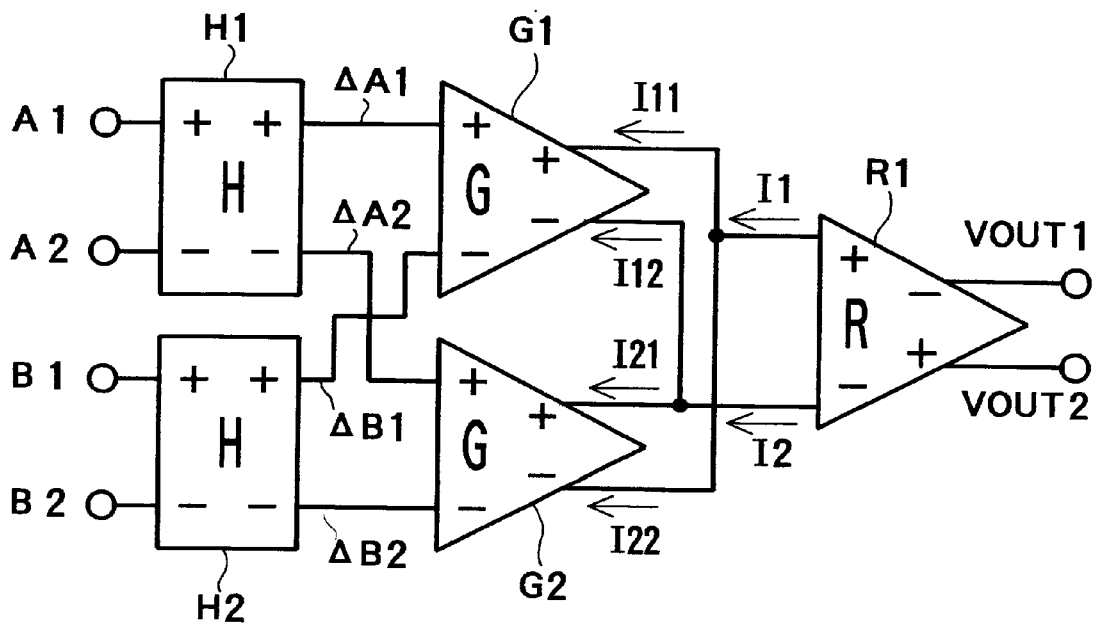
FIG. 1 is a circuit diagram showing the arrangement of a DDA according to the first embodiment of the present invention.

FIG. 1 shows the arrangement of the first embodiment of the present invention. Two pairs of differential input voltages (VA1 and VA2) and (VB1 and VB2) are converted into two pairs of differential voltages (ΔA1 and ΔA2) and (ΔB1 and ΔB2) through first and second voltage conversion circuits, respectively.

Assume that the amplitude of a differential voltage ΔA=ΔA1−ΔA2 is proportional to that of a differential input voltage ΔVA, and as far as the amplitude of the differential voltage ΔVA is constant, the center voltage of the differential voltage ΔA does not vary. Similarly, assume that the amplitude of a differential voltage ΔB=ΔB1−ΔB2 is proportional to that of a differential input voltage ΔVB, and as far as the amplitude of the differential voltage ΔVB is constant, the center voltage of the differential voltage ΔB does not vary. Assume that the two voltage converters have essentially the same characteristics, and as far as the amplitudes of the differential input voltages ΔVA and ΔVB equal, the differential voltages ΔA and ΔB have the same amplitude and center voltage.

Figure 2:
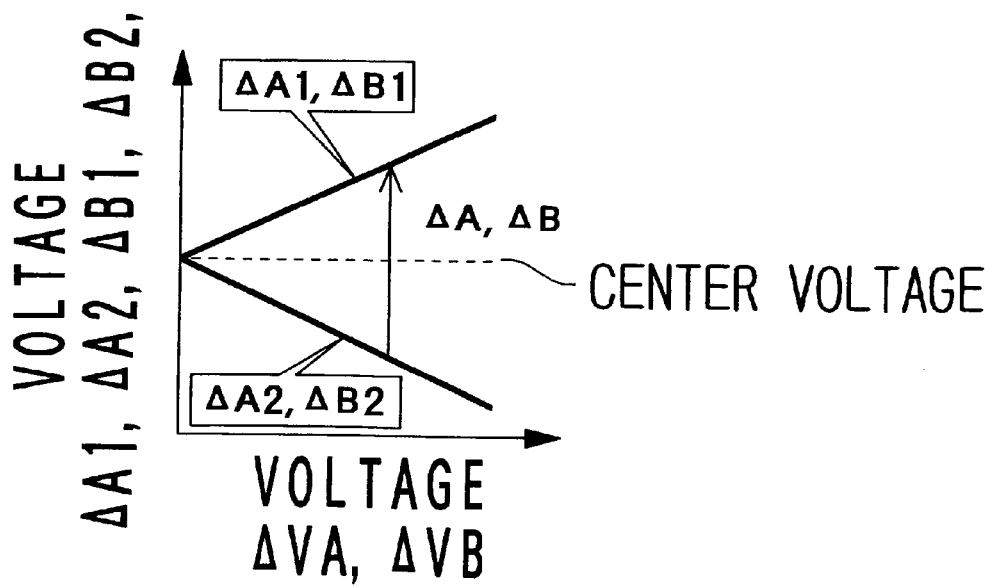
FIG. 2 is a graph showing the characteristics of a voltage converter used in the DDA.

FIG. 2 shows the above relationship.

The differential voltage between the two differential input voltages ΔVA and ΔVB is given by:

$$\Delta VA - \Delta VB = \frac{1}{H}\{(\Delta A1 - \Delta A2) - (\Delta B1 - \Delta B2)\} \quad (10)$$

$$= \frac{1}{H}\{(\Delta A1 - \Delta B1) - (\Delta A2 - \Delta B2)\}$$

where H is the amplification factor of the voltage converter.

When the differential input voltages ΔA1, ΔB1, ΔA2, and ΔB2 are input to the voltage-to-current converter shown in FIG. 1, an output current ΔI becomes:

$$\Delta I = I1 - I2 = G1(\Delta A1 - \Delta B1) - G2(\Delta A2 - \Delta B2) \quad (11)$$

where G1 and G2 are the amplification factors of the voltage-to-current converters.

The amplification factor of the voltage-to-current converter generally changes in accordance with the amplitude of the differential input voltage. Normally, the DDA is negatively fed back such that the two pairs of input voltages are equalized. Therefore, in a steady state, we always have:

$$\Delta A1 = \Delta B1 \quad (12)$$

$$\Delta A2 = \Delta B2 \quad (13)$$

In the steady state, the amplitude of the input voltage of the voltage-to-current converter is zero. Letting the amplification factor of the voltage-to-current converter whose input voltage amplitude is essentially zero be a constant G, we have G1=G2=G. Equation (11) can then be rewritten as:

$$\Delta I = G(\Delta A1 - \Delta B1) - G(\Delta A2 - \Delta B2) \quad (14)$$
$$= GH(\Delta VA - \Delta VB)$$

In the steady state, $\Delta I$ becomes zero. Let the amplification factor of the voltage-to-current converter whose $\Delta I$ is in the neighborhood of zero be a constant R. Then we have:

$$\Delta VOUT = VOUT1 - VOUT2 \quad (15)$$
$$= RGH(\Delta VA - \Delta VB)$$
$$= A((VA1 - VA2) - (VB1 - VB2))$$

for $$A = RGH$$

As is apparent from equation (15), the circuit shown in FIG. 1 functions as a DDA. More specifically, two pairs of differential input voltages are converted into two pairs of differential voltages through voltage converters whose output voltages are determined only by the input voltage amplitudes. The voltage across the positive terminals and the voltage across the negative terminals of the two pairs of differential voltages, i.e., the outputs from the voltage converter are converted into two pairs of differential currents through voltage-to-current converters whose amplification factors become constant at an input voltage amplitude in the vicinity of zero. In addition, an output voltage nearly proportional to the difference between the two differential currents is obtained through a current-to-voltage converter. With this arrangement, a DDA can be constituted.

The DDA shown in FIG. 1 is basically different from the conventional DDA in the following point. In the conventional DDA, a current corresponding to the amplitude of one differential input voltage is subtracted from a current corresponding to the amplitude of the other differential input voltage. In this embodiment, a current corresponding to the difference between the negative-side input voltages of the two pairs of differential input voltages is subtracted from a current corresponding to the difference between the positive-side input voltages of the two pairs of differential input voltages.

In the conventional circuit, the differential current corresponding to the differential input voltages $\Delta VA$ and $\Delta VB$ is:

$$\leftarrow I = K1\Delta VA - K2\Delta VB \quad (16)$$

where K1 and K2 are the amplification factors of voltage-to-current converters for receiving the differential input voltages. Ideally, K1=K2, although it is assumed herein that K1≠K2.

Rewriting equation (16) yields:

$$\Delta I = K1(\Delta VA - \Delta VB) + (K1 - K2)\Delta VB \quad (17)$$

The second term of equation (17) represents an error. The error increases in proportion to the amplitude of the differential input voltage. In this embodiment, let the positive-side input voltage difference of the differential input voltages be $\Delta V^+$, and the negative-side input voltage difference of the differential input voltages be $\Delta V^-$. Then, the differential output current is given by:

$$\Delta I = K1\Delta V^+ - K2\Delta V^- \quad (18)$$
$$= K1(\Delta V^+ - \Delta V^-) + (K1 - K2)\Delta V^- \quad (19)$$

The second term of equation (19) represents an error. However, since $\Delta V^-$ is zero at a stable point, the error is zero.

In this embodiment, even when the amplification factors of two voltage-to-current converters have errors, no errors are generated eventually.

Examples of voltage converters H1 and H2 used in the first embodiment shown in FIG. 1 will be described.

Figure 3:
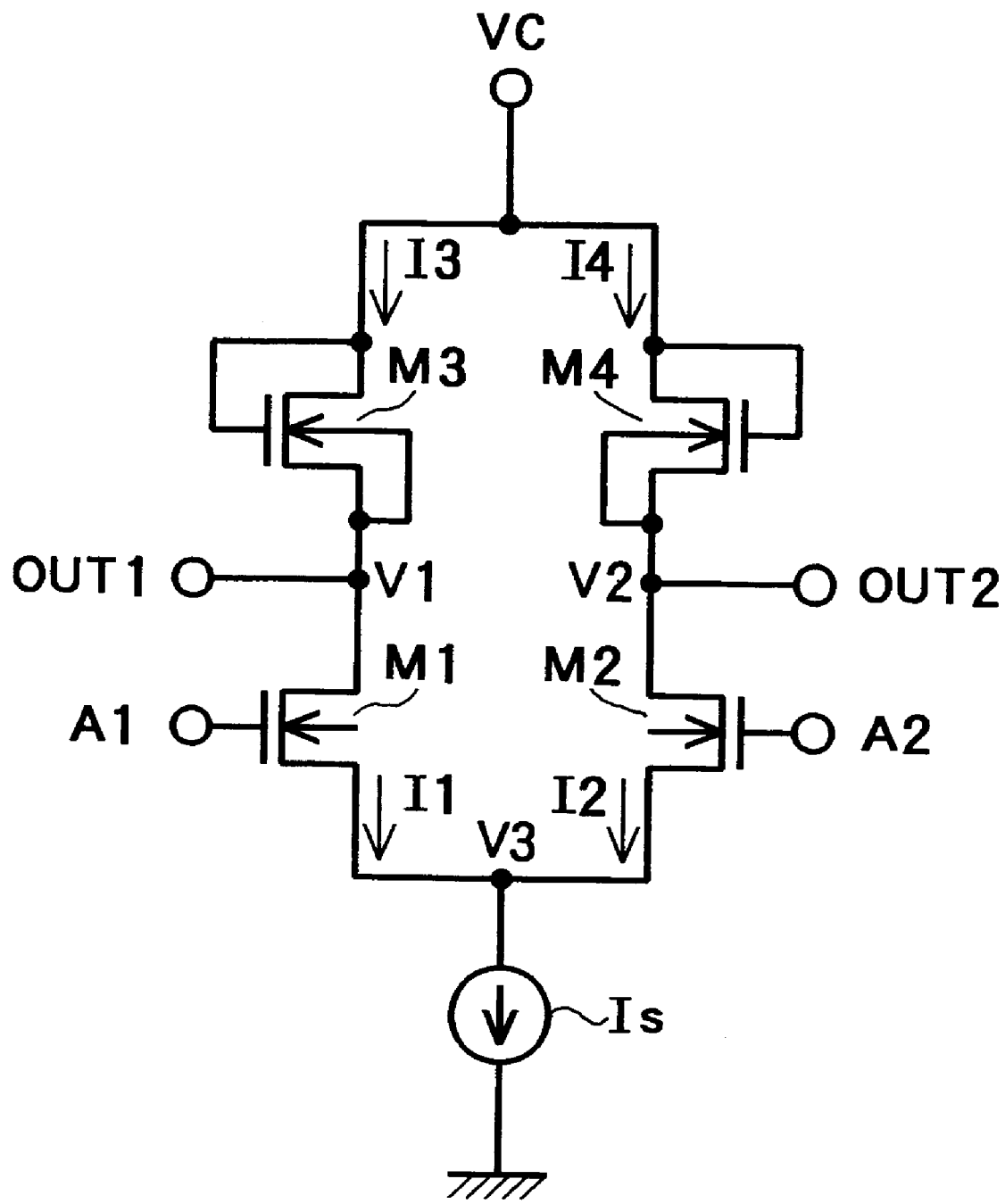
FIG. 3 is a circuit diagram showing the first example of the voltage conversion circuit used in the DDA according to the first embodiment.

Referring to FIG. 3, reference symbols A1 and A2 denote input voltage terminals; and OUT1 and OUT2, output voltage terminals. N-channel MOS transistors M1 and M2 have essentially the same characteristics as well as n-channel MOS transistors M3 and M4. Currents I1, I2, I3, and I4 flow in the transistors M1, M2, M3, and M4, respectively. Reference symbol Is denotes a constant current source.

The currents I1, I2, I3, and I4 are respectively given by:

$$I1 = Kn1(VA1 - V3 - Vthn1)^2 \quad (20)$$

$$I2 = Kn2(VA2 - V3 - Vthn2)^2 \quad (21)$$

$$I3 = Kn3(VC - V1 - Vthn3)^2 \quad (22)$$

$$I4 = Kn4(VC - V2 - Vthn4)^2 \quad (23)$$

for $$Kni = \frac{\mu Cox}{2} \frac{Wi}{Li} \quad (24)$$

where Wi and Li are the gate width and gate length of a transistor Mi, respectively.

Since the transistors M1 and M3 are connected in series, I1=I3. From equations (20) and (22) we have:

$$\sqrt{Kn1}(VA1 - V3 - Vthn1) = \sqrt{Kn3}(VC - V1 - Vthn3) \quad (25)$$

$$V1 = -\frac{\sqrt{Kn1}}{\sqrt{Kn3}}(VA1 - V3 - Vthn1) + VC - Vthn3 \quad (26)$$

Similarly, if I2=I4, then:

$$\sqrt{Kn2}\,(VA2 - V3 - Vthn2) = \sqrt{Kn4}\,(VC - V4 - Vthn4) \quad (27)$$

$$V2 = -\frac{\sqrt{Kn2}}{\sqrt{Kn4}}(VA2 - V3 - Vthn2) + VC - Vthn4 \quad (28)$$

Since the transistors M1 and M2 have essentially the same characteristics, and so do the transistors M3 and M4, Kn1=Kn2, Kn3=Kn4, Vthn1=Vthn2, and Vthn3=Vthn4. Then from equations (26) and (28), we have:

$$V1 - V2 = -\frac{\sqrt{Kn1}}{\sqrt{Kn3}}(VA1 - VA2) \quad (29)$$

That is, the output voltage amplitude is proportional to the input voltage amplitude.

Next, the center voltage of the output voltage is calculated. Using equations (26) and (28) gives:

$$\frac{V1 + V2}{2} = -\frac{\sqrt{Kn1}}{\sqrt{Kn3}}\left\{\frac{VA1 + VA2}{2} - V3 - Vthn1\right\} + VC - Vthn3 \quad (30)$$

As is apparent, for a differential current pair constituted by the transistors M1 and M2 and the constant current source Is, we have:

$$\frac{VA1 + VA2}{2} = V3 + Vthn1 + \frac{1}{2}\sqrt{\frac{2Is}{Kn1} - (VA1 - VA2)^2} \quad (31)$$

Substitution of equation (31) into equation (30) yields:

$$\frac{VA1 + VA2}{2} = -\frac{\sqrt{Kn1}}{2\sqrt{Kn3}}\sqrt{\frac{2Is}{Kn1} - (VA1 - VA2)^2} + VC - Vthn3 \quad (32)$$

That is, the center voltage of the output voltage is determined only by the input voltage amplitude.

Figure 4:
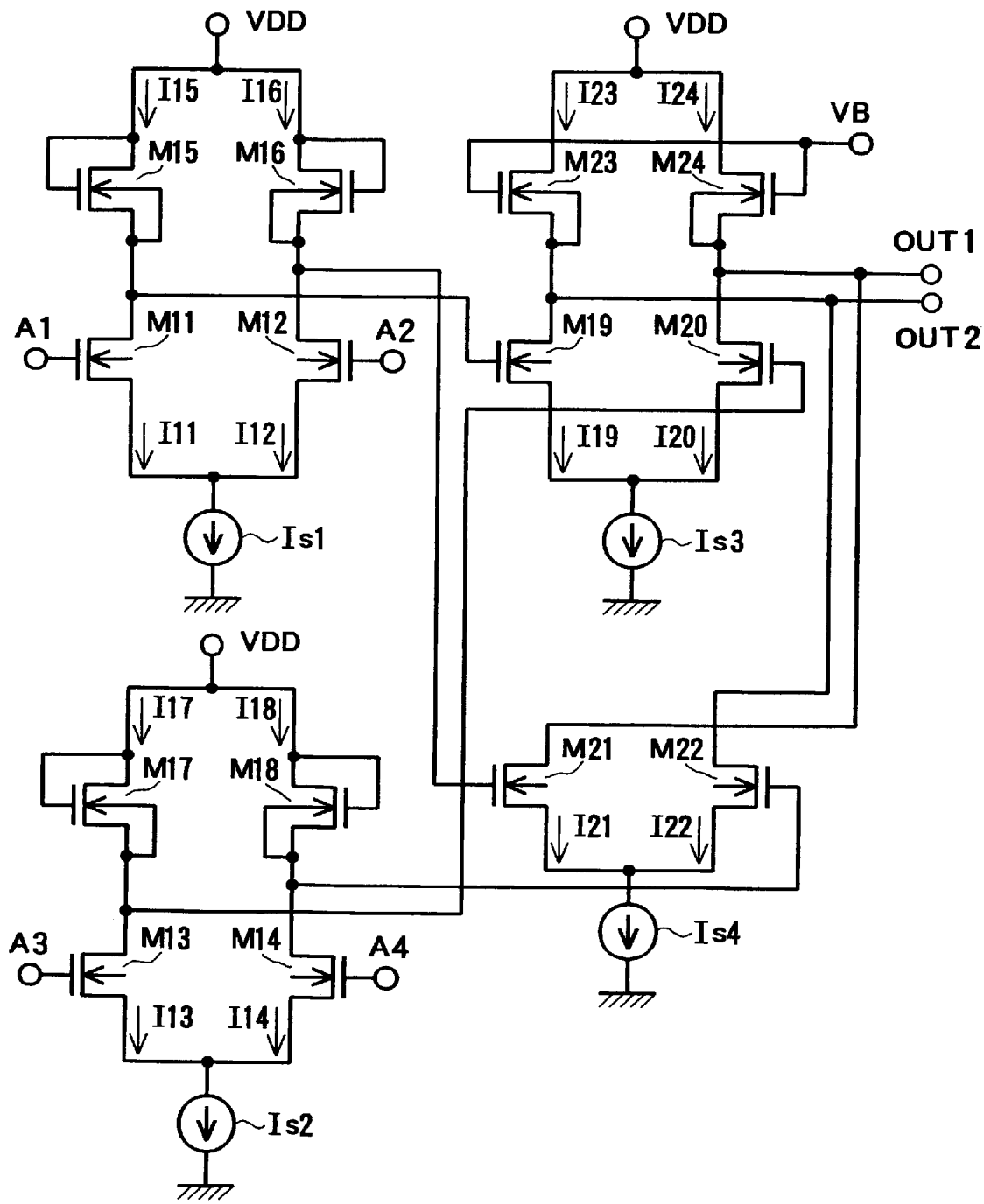
FIG. 4 is a circuit diagram showing the circuit arrangement of the DDA of the first embodiment using the voltage conversion circuit shown in FIG. 3.

FIG. 4 shows the arrangement of the DDA shown in FIG. 1 which uses the output voltage converter shown in FIG. 3.

Referring to FIG. 4, reference symbols A1 and A2 denote first differential input voltages; and A3 and A4, second differential input voltages.

The voltage conversion circuit H1 is constituted by transistors M11, M12, M15, and M16, and a constant current source Is1. The voltage conversion circuit H2 is constituted by transistors M13, M14, M17, and M18, and a constant current source Is2. The voltage conversion circuit H2 has essentially the same characteristics as those of the voltage conversion circuit H1. Transistors M19 and M20, and a constant current source Is3 constitute a voltage-to-current converter G1. Transistors M21 and M22, and a constant current source Is4 constitute a voltage-to-current converter G2 having essentially the same characteristics as those of the voltage-to-current converter G1. P-channel MOS transistors M23 and M24 have essentially the same characteristics and constitute a current-to-voltage converter R1. Reference symbol VB denotes a reference voltage; and OUT1 and OUT2, output terminals.

Details of the circuit arrangement of the voltage conversion circuit of the first embodiment shown in FIG. 1 will be described next with reference to FIG. 5. N-channel MOS transistors M31 and M32 have essentially the same characteristics, and so do p-channel MOS transistors M33 and M34.

Currents I31, I32, I33, and I34 flow in the transistors M31, M32, M33, and M34, respectively.

The currents I31, I32, I33, and I34 are respectively given by:

$$I31 = Kn31(VA1 - V33 - Vthn31)^2 \quad (33)$$

$$I32 = Kn32(VA2 - V33 - Vthn32)^2 \quad (34)$$

$$I33 = Kp33(VC - V31 - |Vthp33|)^2 \quad (35)$$

$$I34 = Kp34(VC - V32 - |Vthp34|)^2 \quad (36)$$

for $$Kn, p3i = \frac{\mu Cox}{2}\frac{W3i}{L3i} \quad (37)$$

where W3i and L3i are the gate width and gate length of a transistor M3i, respectively.

Since the transistors M31 and M33 are connected in series, I31=I33. Then from equations (33) and (35), we have:

$$\sqrt{Kn31}\,(VA1 - V33 - Vthn31) = \sqrt{Kp33}\,(VC - V31 - |Vthp33|) \quad (38)$$

$$V31 = -\frac{\sqrt{Kn31}}{\sqrt{Kp33}}(VA1 - V33 - Vthn31) + VC - |Vthp33| \quad (39)$$

Likewise, if I32=I34, then:

$$\sqrt{Kn32}\,(VA2 - V33 - Vthn32) = \sqrt{Kp34}\,(VC - V32 - |Vthp34|) \quad (40)$$

$$V32 = -\frac{\sqrt{Kn32}}{\sqrt{Kp34}}(VA2 - V33 - Vthn32) + VC - |Vthp34| \quad (41)$$

Since the transistors M31 and M32 have essentially the same characteristics, and so do the transistors M33 and M34, Kn1=Kn2, Kp3=Kp4, Vthn31=Vthn32, and Vthp33=Vthp34. Thus from equations (39) and (41), we obtain:

$$V31 - V32 = -\frac{\sqrt{Kn31}}{\sqrt{Kp33}}(VA1 - VA2) \quad (42)$$

That is, the output voltage amplitude is proportional to the input voltage amplitude.

Next, the center voltage of the output voltage is calculated. Using equations (39) and (41) gives:

$$\frac{V31 + V32}{2} = -\frac{\sqrt{Kn31}}{\sqrt{Kp33}}\left\{\frac{VA1 + VA2}{2} - V33 - Vthn31\right\} + VC - |Vthp33| \quad (43)$$

Evidently, for a differential current pair constituted by the transistors M31 and M32 and a constant current source Is31, we have:

$$\frac{VA1+VA2}{2} = V33 + Vthn31 + \frac{1}{2}\sqrt{\frac{2Is}{Kn31} - (VA1-VA2)^2} \quad (44)$$

Substitution of equation (44) into equation (43) yields:

$$\frac{V1+V2}{2} = -\frac{\sqrt{Kn31}}{2\sqrt{Kp33}}\sqrt{\frac{2Is}{Kn31} - (VA1-VA2)^2} + VC - |Vthp33| \quad (45)$$

That is, the center voltage of the output voltage is determined only by the input voltage amplitude.

Figure 5:
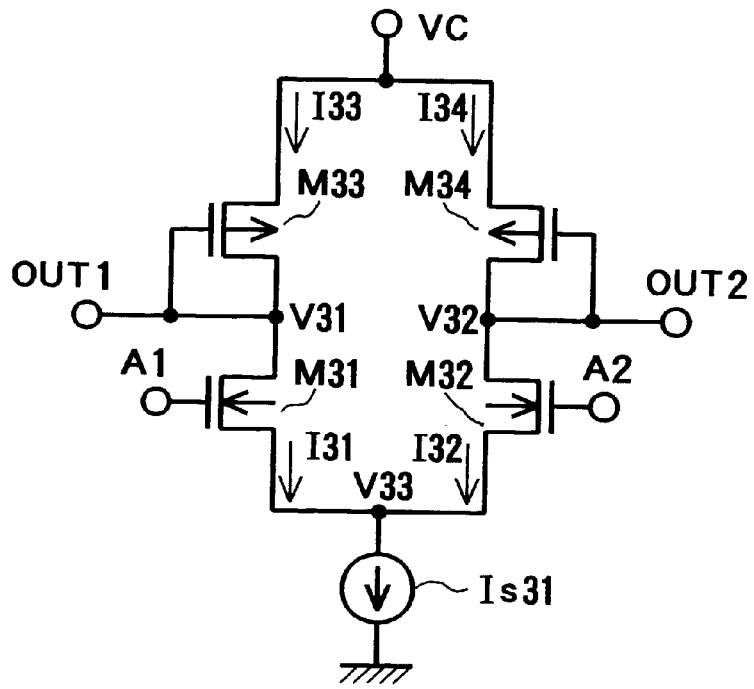
FIG. 5 is a circuit diagram showing the second example of the voltage conversion circuit used in the DDA according to the first embodiment.

Like the voltage converter shown in FIG. 3, the voltage converter shown in FIG. 5 can also be applied to the DDA of the first embodiment shown in FIG. 1.

In the voltage converter shown in FIG. 3, the substrates of the MOS transistors M3 and M4 must be connected to their sources to eliminate the substrate bias effect. In this arrangement, however, p-type wells are connected to the sources, resulting in an increase in pattern area. To the contrary, the circuit shown in FIG. 5 need not consider the substrate bias effect, so the pattern area can be reduced.

To increase the output voltage amplitude of the voltage converter shown in FIG. 3 or 5, the variation range of the input voltage must be narrowed. To obtain a high output voltage without narrowing the variation range of the input voltage, a voltage converter shown in FIG. 6 can be used. More specifically, according to the circuit shown in FIG. 6, the variation range of nodes N41 and N42 can be made as small as possible, and the variation ranges of the input and output voltages can be ensured as wide as possible.

N-channel MOS transistors M41 and M42 have essentially the same characteristics, and so do p-channel MOS transistors M43 and M44. Also, n-channel MOS transistors M45 and M46 have essentially the same characteristics, and so do p-channel MOS transistors M47 and M48. A current I4i flows in a transistor Mi.

Currents I41, I42, I43, and I44 are respectively given by:

$$I41 = Kn41(VA1-V43-Vthn41)^2 \quad (46)$$

$$I42 = Kn42(VA2-V43-Vthn42)^2 \quad (47)$$

$$I43 = Kp43(VDD-V41-|Vthp43|)^2 \quad (48)$$

$$I44 = Kp44(VDD-V42-|Vthp44|)^2 \quad (49)$$

for $$Kn, p4i = \frac{\mu Cox}{2}\frac{W4i}{L4i} \quad (50)$$

where W4i and L4i are the gate width and gate length of a transistor M4i, respectively.

Since the transistors M41 and M43 are connected in series, I41=I43. From equations (46) and (48), we have:

$$\sqrt{Kn41}(VA1-V43-Vthn41) = \sqrt{Kp43}(VDD-V41-|Vthp43|) \quad (51)$$

$$V41 = -\frac{\sqrt{Kn41}}{\sqrt{Kp43}}(VA1-V43-Vthn41) + VDD - |Vthp43| \quad (52)$$

Again, if I42=I44, then:

$$\sqrt{Kn42}(VA2-V43-Vthn42) = \sqrt{Kp44}(VDD-V42-|Vthp44|) \quad (53)$$

$$V42 = -\frac{\sqrt{Kn42}}{\sqrt{Kp44}}(VA2-V43-Vthn42) + VDD - |Vthp44| \quad (54)$$

Currents I45, I46, I47, and I48 are respectively given by:

$$I45 = Kn45(V45-VC-Vthn45)^2 \quad (55)$$

$$I46 = Kn46(V46-VC-Vthn46)^2 \quad (56)$$

$$I47 = Kp47(VDD-V41-|Vthp47|)^2 \quad (57)$$

$$I48 = Kp48(VDD-V42-|Vthp48|)^2 \quad (58)$$

Letting Vthp47=Vthp48=Vthp43=Vthp44, we have:

$$I47 = \frac{Kp47}{Kp43}Kn41(VA1-V43-Vthn41)^2 \quad (59)$$

$$I48 = \frac{Kp48}{Kp44}Kn42(VA2-V43-Vthn42)^2 \quad (60)$$

Since the transistors M45 and M47 are connected in series, I45=I47. From equations (55) and (57), we have:

$$Kn45(V45-VC-Vthn45)^2 = \frac{Kp47}{Kp43}Kn41(VA1-V43-Vthn41)^2 \quad (61)$$

$$V45 = \sqrt{\frac{Kp47Kn41}{Kp43Kn45}}(VA1-V43-Vthn41) + VC + Vthn45 \quad (62)$$

Similarly, since the transistors M46 and M48 are connected in series, I46=I48. From equations (56) and (58), we have:

$$Kn46(V46-VC-Vthn46)^2 = \frac{Kp48}{Kp44}Kn42(VA2-V43-Vthn42)^2 \quad (63)$$

$$V46 = \sqrt{\frac{Kp48Kn42}{Kp44Kn46}}(VA2-V43-Vthn42) + VC + Vthn46 \quad (64)$$

Since the transistors M41 and M42, M45 and M46, M43 and M44, and M47 and M48 have essentially the same characteristics, respectively, the output voltage amplitude is given on the basis of equations (62) and (64) by:

$$V45 - V46 = \sqrt{\frac{Kp47Kn41}{Kp43Kn45}}(VA1-VA2) \quad (65)$$

The center voltage of the output voltage is:

$$\frac{V45+V46}{2} = \\ -\frac{1}{2}\sqrt{\frac{Kp47Kn41}{Kp43Kn45}}\sqrt{\frac{2Is}{Kn41} - (VA1-VA2)^2} + VC + Vthn45 \quad (66)$$

That is, the center voltage of the output voltage is determined only by the input voltage amplitude.

Figure 6:
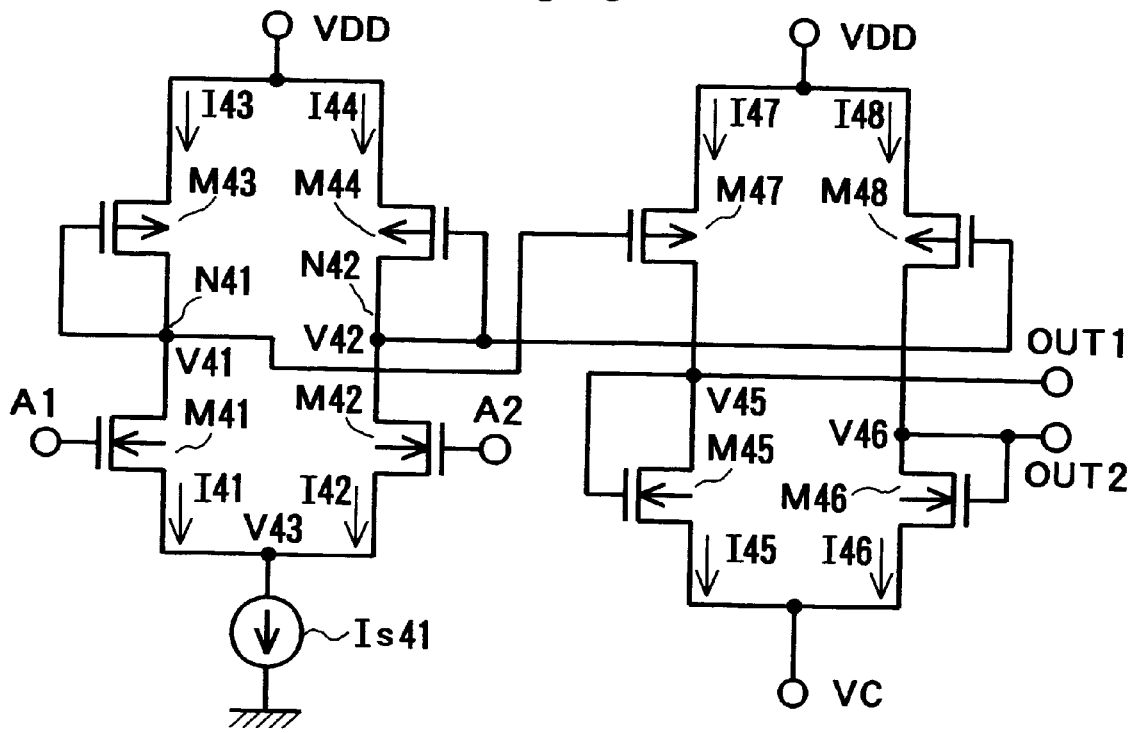
FIG. 6 is a circuit diagram showing the third example of the voltage conversion circuit used in the DDA according to the first embodiment.
Figure 7:
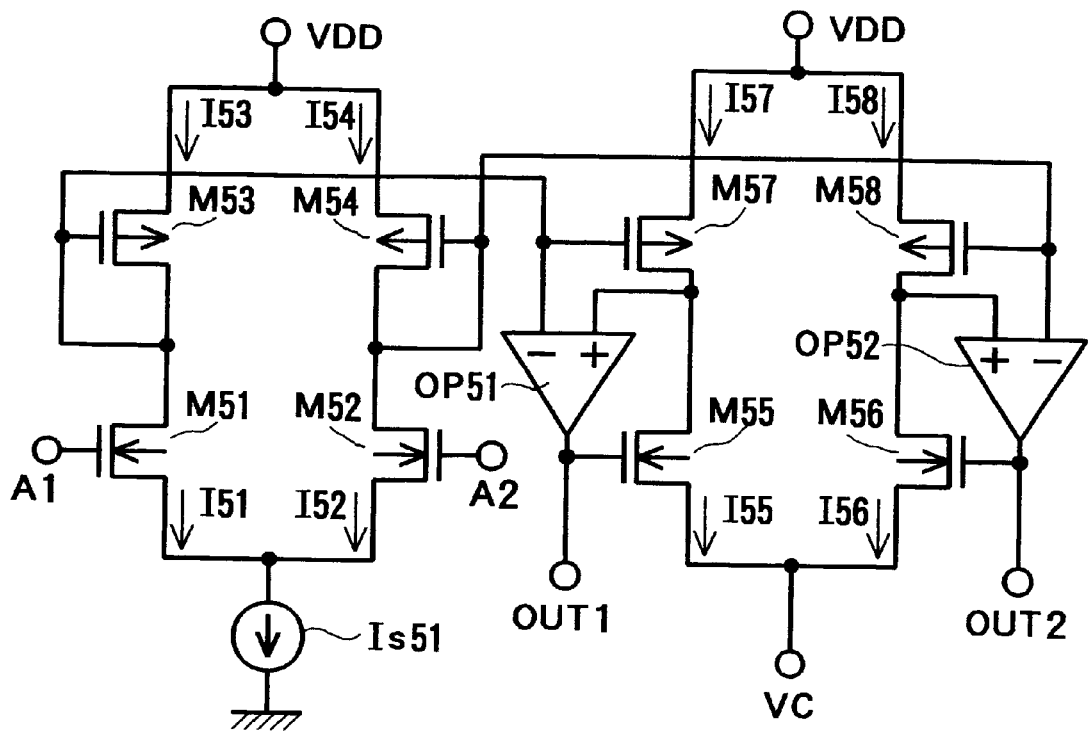
FIG. 7 is a circuit diagram showing the fourth example of the voltage conversion circuit used in the DDA according to the first embodiment.

Like the voltage converter shown in FIG. 6, the voltage converter shown in FIG. 7 can also be applied to the DDA of the first embodiment shown in FIG. 1.

In the circuit shown in FIG. 7, n-channel MOS transistors M51 and M52 have essentially the same characteristics, and so do p-channel MOS transistors M53 and M54. N-channel MOS transistors M55 and M56 have essentially the same characteristics, and so do p-channel MOS transistors M57 and M58. Operational amplifiers OP51 and OP52 control the drain voltages of transistors M57 and M58 to equal those of the transistors M53 and M54. With this arrangement, $$I57/I53 = I58/I54 \quad (67)$$

holds at a higher accuracy.

In the circuit shown in FIG. 7 as well, like the circuit shown in FIG. 6, the output voltage amplitude is given by:

$$VOUT1 - VOUT2 = \sqrt{\frac{Kp57Kn51}{Kp53Kn55}}(VA1 - VA2) \quad (68)$$

The center voltage of the output voltage is:

$$\frac{VOUT1 + VOUT2}{2} = \quad (69)$$

$$-\frac{1}{2}\sqrt{\frac{Kp57Kn51}{Kp53Kn55}}\sqrt{\frac{2Is}{Kn51} - (VA1 - VA2)^2} + VC + Vthn55$$

That is, the output voltage is determined only by the input voltage amplitude.

Figure 8:
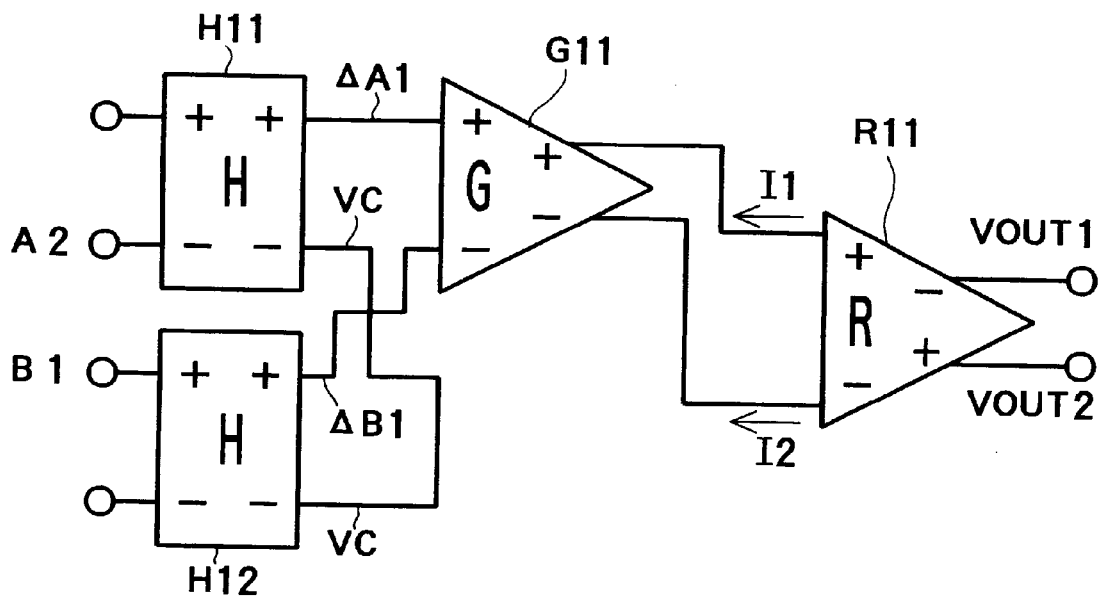
FIG. 8 is a circuit diagram showing the arrangement of a DDA according to the second embodiment of the present invention.

FIG. 8 shows the arrangement of a DDA according to the second embodiment of the present invention.

In the DDA according to the first embodiment shown in FIG. 1, assume that the differential output voltage amplitudes of voltage conversion circuits H1 and H2 are proportional to the differential input voltage amplitudes, and the voltage of the negative terminals of the voltage conversion circuits H1 and H2 is a reference voltage. For example, assume that the output voltage of the negative terminal is a reference voltage VC. In this case, both the negative-side output voltages of the two voltage conversion circuits H1 and H2 always equal VC. For this reason, the output current of a voltage-to-current converter G2 is always zero, so the voltage-to-current converter G2 can be omitted. In the DDA according to the second embodiment having this arrangement, the difference between the two differential input voltages is written as:

$$\Delta VA - \Delta VB = \frac{1}{H}\{(\Delta A1 - VC) - (\Delta B1 - VC)\} \quad (70)$$

$$= \frac{1}{H}(\Delta A1 - \Delta B1)$$

where H is the amplification factor at a stable point of the voltage converter.

As is apparent from equation (70), when the positive terminal of the voltage converter is considered as an output terminal, conditions for the DDA are already satisfied. Since the amplification factor is small in this state, the output voltage is obtained through a voltage amplifier.

Let the amplification factors of a voltage-to-current converter G11 and a current-to-voltage converter r11 are represented by G and R. Then, the output voltage ΔV(VOUT1−VOUT2) is given by:

$$\Delta V = RG(\Delta A1 - \Delta B1) \quad (71)$$

$$= RGH(\Delta VA - \Delta VB)$$

$$= A\{(VA1 - VA2) - (VB1 - VB2)\}$$

for A=RGH
and this circuit operates as a DDA.

The DDA of the second embodiment has a simpler arrangement than that of the first embodiment. Although the arrangement of voltage converters H11 and H12 may be complicated to result in a low accuracy, the device area of the second embodiment can be made smaller.

Figure 9:
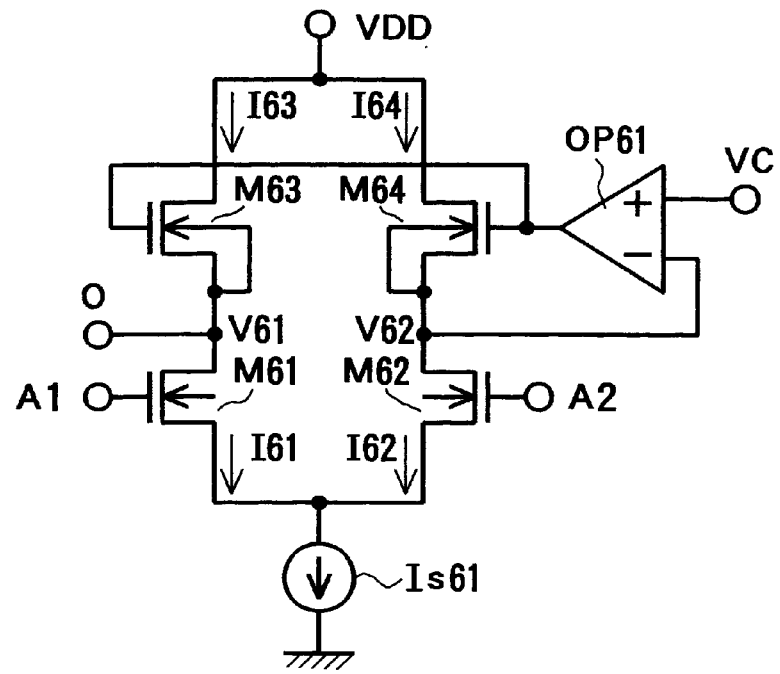
FIG. 9 is a circuit diagram showing the first example of a voltage conversion circuit used in the DDA according to the second embodiment.

FIG. 9 shows an example of the circuit of the voltage converters H1 and H1 used in the second embodiment. N-channel MOS transistors M61 and M62 and n-channel MOS transistors M63 and M64 have essentially the same characteristics, respectively. Each of the transistors M61 to M64 operates as a pentode. The circuit shown in FIG. 9 is obtained by adding an operational amplifier OP61 for fixing one output voltage at the reference voltage to the circuit shown in FIG. 3. A terminal voltage V62 is always fixed at the reference voltage VC by the operational amplifier OP61.

As in the circuit shown in FIG. 3, the output voltage amplitude is given by:

$$V61 - VC = -\frac{\sqrt{Kn61}}{\sqrt{Kn63}}(VA1 - VA2) \quad (72)$$

The output voltage amplitude is proportional to the input voltage amplitude.

Figure 10:
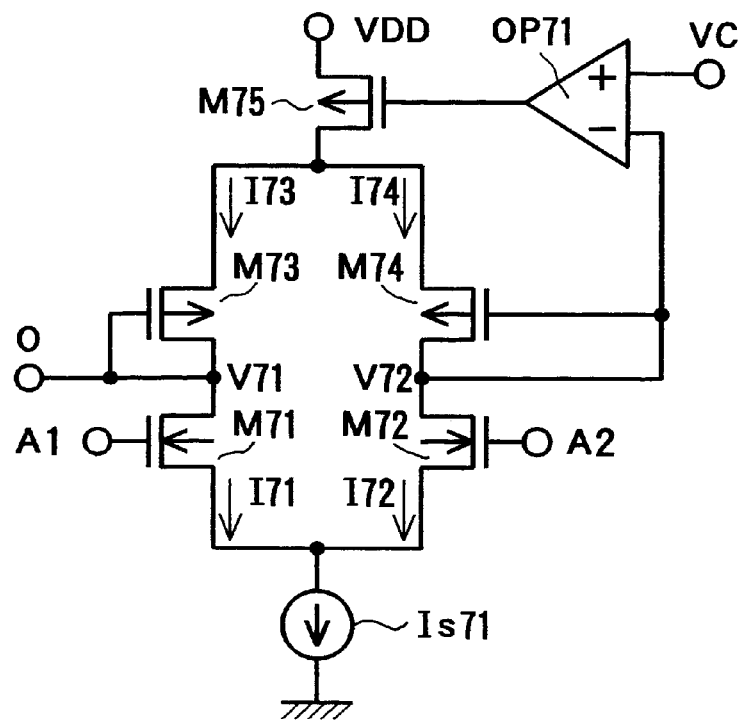
FIG. 10 is a circuit diagram showing the second example of the voltage conversion circuit used in the DDA according to the second embodiment.

FIG. 10 shows the second example of the voltage converter applicable to the second embodiment.

Referring to FIG. 10, n-channel MOS transistors M71 and M72 have essentially the same characteristics, and so do p-channel MOS transistors M73 and M74. Each of the transistors M71 to M74 operates as a pentode, and a transistor M75 as a triode.

The circuit shown in FIG. 10 is obtained by adding an operational amplifier OP71 for fixing one output voltage at the reference voltage to the circuit shown in FIG. 5. A terminal voltage V72 is always fixed at the reference voltage VC by the operational amplifier OP71.

As in the circuit shown in FIG. 5, the output voltage amplitude is given by:

$$V71 - VC = -\frac{\sqrt{Kn71}}{\sqrt{Kn73}}(VA1 - VA2) \quad (73)$$

The output voltage amplitude is proportional to the input voltage amplitude.

Figure 11:
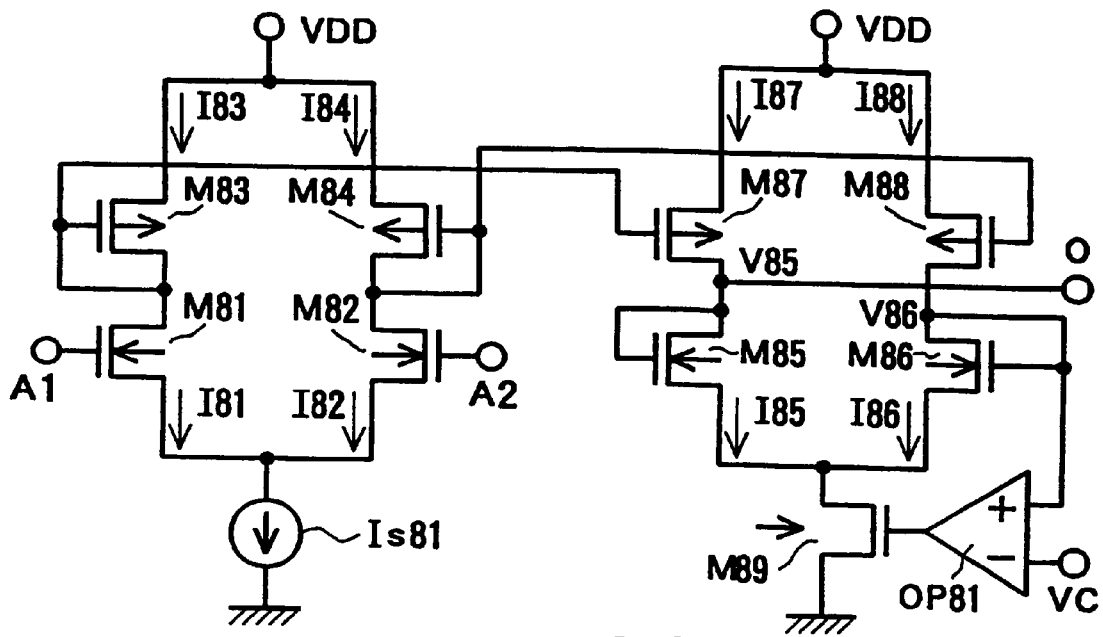
FIG. 11 is a circuit diagram showing the third example of the voltage conversion circuit used in the DDA according to the second embodiment.

FIG. 11 shows the third example of the voltage converter applicable to the DDA according to the second embodiment.

Referring to FIG. 11, n-channel MOS transistors M81 and M82 and n-channel MOS transistors M85 and M86 have essentially the same characteristics, respectively. P-channel MOS transistors M83 and M84 and p-channel MOS transistors M87 and M88 have essentially the same characteristics, respectively.

Each of the transistors M81 to M88 operates as a pentode, and a transistor M89 as a triode.

The circuit shown in FIG. 11 is obtained by adding an operational amplifier OP81 for fixing one output voltage at the reference voltage to the circuit shown in FIG. 6. A terminal voltage V86 is always fixed at the reference voltage VC by the operational amplifier OP81.

As in the circuit shown in FIG. 6, the output voltage amplitude is given by:

$$V85 - VC = \frac{\sqrt{Kp87Kn81}}{\sqrt{Kp83Kn85}}(VA1 - VA2) \tag{74}$$

The output voltage amplitude is proportional to the input voltage amplitude.

In the circuit shown in FIG. 11, the dynamic range of the input/output voltage can be widened, as in the circuit shown in FIG. 6.

Figure 12:
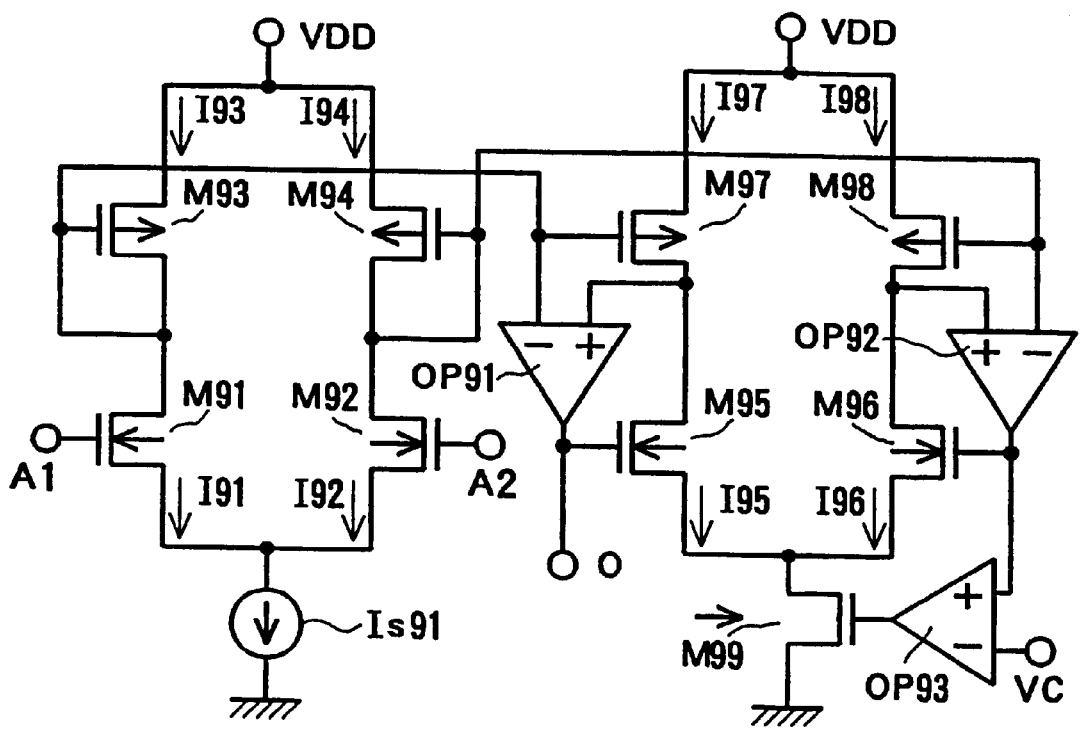
FIG. 12 is a circuit diagram showing the fourth example of the voltage conversion circuit used in the DDA according to the second embodiment.

FIG. 12 shows the fourth example of the voltage converter applicable to the DDA according to the second embodiment.

Referring to FIG. 12, n-channel MOS transistors M91 and M92 and n-channel MOS transistors M95 and M96 have essentially the same characteristics, respectively. P-channel MOS transistors M93 and M94 and p-channel MOS transistors M97 and M98 have essentially the same characteristics, respectively. Each of the transistors M91 to M98 operates as a pentode, and a transistor M99 as a triode.

The circuit shown in FIG. 12 is obtained by adding the transistor M99 to the circuit shown in FIG. 7 in place of the reference power supply VC and adding an operational amplifier OP93 to this circuit to always set VOUT2 at VC.

The output voltage amplitude is given by equation (75) below, as in the circuit shown in FIG. 7. The output voltage amplitude is proportional to the input voltage amplitude. In the circuit shown in FIG. 12, the dynamic range of the input/output voltage can be increased, as in the circuit shown in FIG. 11, and the accuracy is high.

$$VO - VC = \frac{\sqrt{Kp97Kn91}}{\sqrt{Kp93Kn95}}(VA1 - VA2) \tag{75}$$

Figure 13:
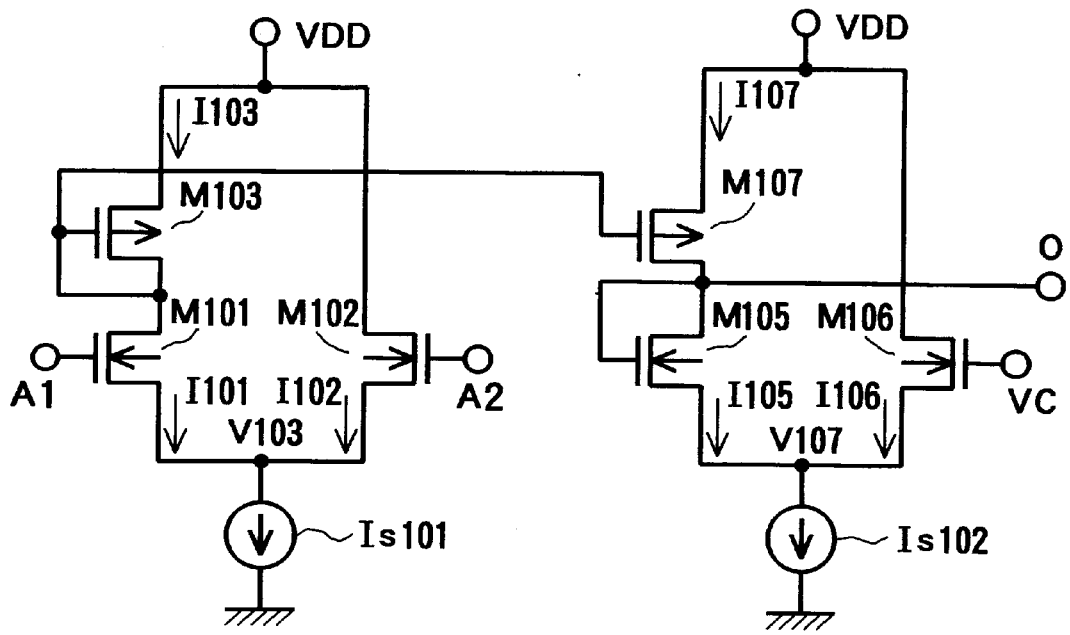
FIG. 13 is a circuit diagram showing the fifth example of the voltage conversion circuit used in the DDA according to the second embodiment.

FIG. 13 shows the fifth example of the voltage converter applicable to the second embodiment.

In the circuit shown in FIG. 12, n-channel MOS transistors M101, N102, N105, and M106 have essentially the same characteristics. P-channel MOS transistors M103 and M107 have essentially the same characteristics. Constant current sources Is101 and Is102 have essentially the same characteristics. Each of the transistors M101 to M107 operates as a pentode. Since the transistors M103 and M107 have matched characteristics, we have:

$$I101=I105 \tag{76}$$

$$I102=I106 \tag{77}$$

Therefore, $$VA1-V103=VO-V107 \tag{78}$$

$$VA2-V103=VC-V107 \tag{79}$$

Also, from equations (78) and (79):

$$VO-VC=VA1-VA2 \tag{80}$$

As is apparent from equation (80), the output voltage amplitude equals the input voltage amplitude.

The circuit shown in FIG. 13 does not contain an operational amplifier, so no problems of errors and delays caused by the operational amplifier are posed. However, since the circuit is not symmetrical, the symmetry of output voltages is poor.

Figure 14:
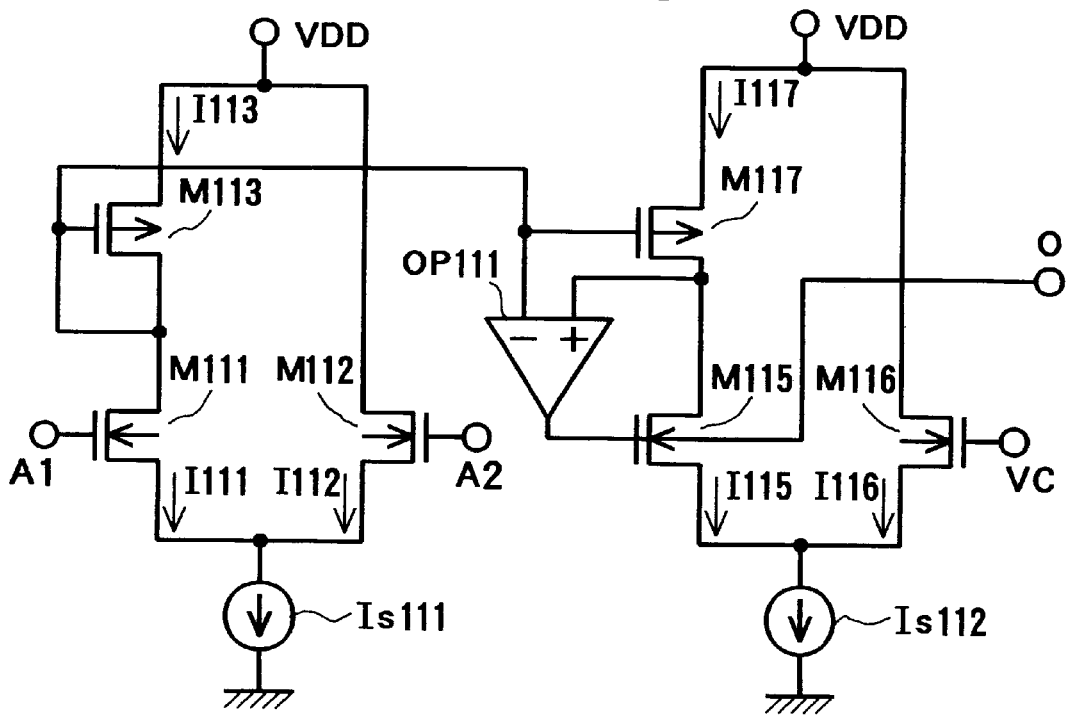
FIG. 14 is a circuit diagram showing the sixth example of the voltage conversion circuit used in the DDA according to the second embodiment.

FIG. 14 shows the sixth example of the voltage converter applicable to the second embodiment.

Referring to FIG. 14, n-channel MOS transistors M111, M112, M115, and M116 have essentially the same characteristics. P-channel MOS transistors M113 and M117 have essentially the same characteristics. Constant current sources Is111 and Is112 have essentially the same characteristics. Each of the transistors M111, M112, M113, M115, M116, and M117 operates as a pentode.

In the circuit shown in FIG. 14, an operational amplifier OP11 is inserted into the circuit shown in FIG. 13. With this arrangement, the drain voltages of the transistors M113 and M117 are always equalized, and currents flowing in the transistors M113 and M117 are always equalized, thereby improving the accuracy. The relationship between the output voltage and the input voltage becomes as represented by equation (80), as in the circuit shown in FIG. 13. According to the circuit shown in FIG. 14, an accuracy higher than that of the circuit shown in FIG. 13 can be obtained.

Figure 15:
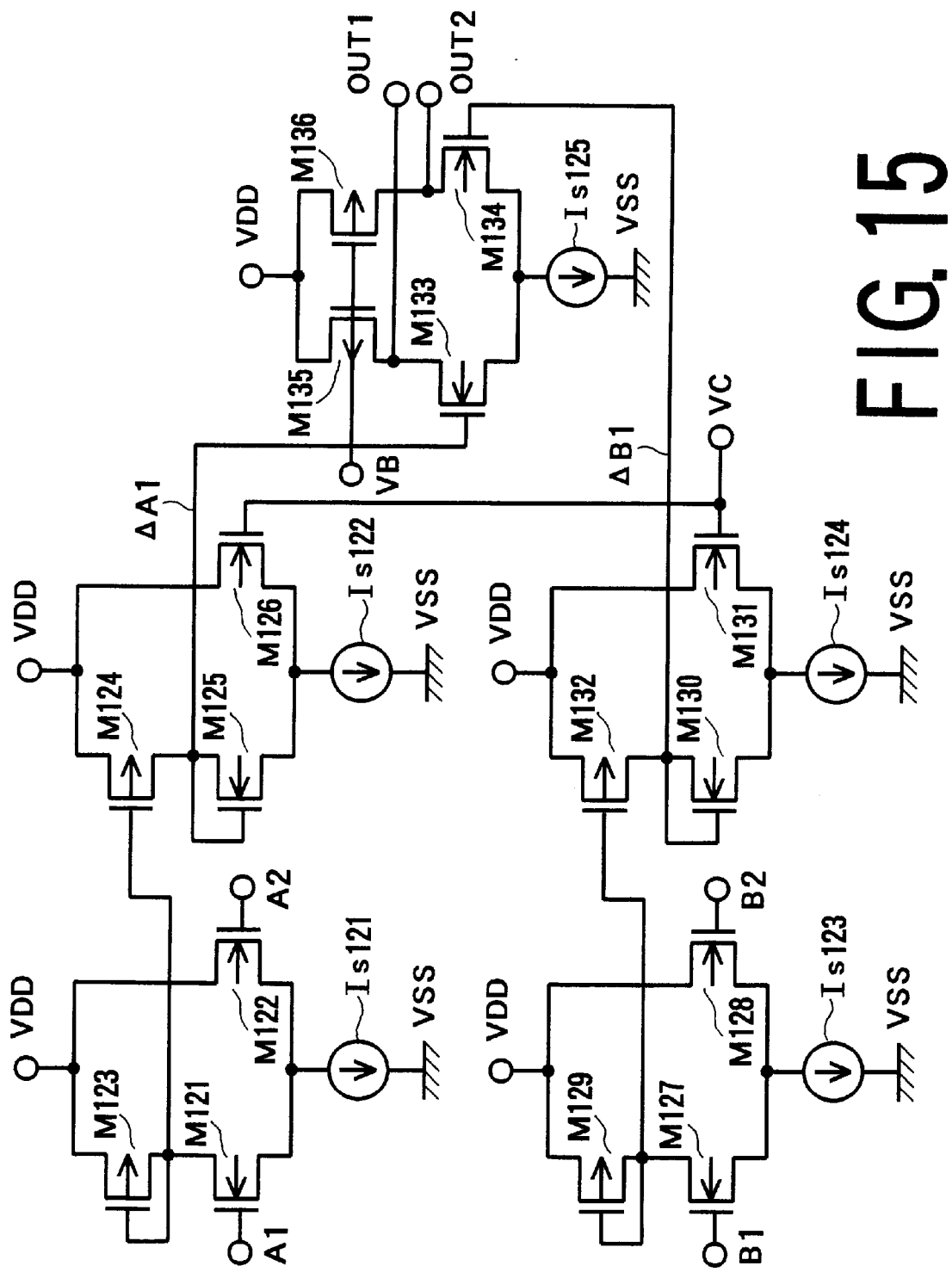
FIG. 15 is a circuit diagram showing the circuit arrangement of a DDA using the voltage conversion circuit shown in FIG. 13.

FIG. 15 shows the arrangement of the DDA according to the second embodiment using a single output voltage converter 5 shown in FIG. 13.

Transistors M121 to M126 and current sources Is121 and Is122 constitute the voltage conversion circuit H11. Transistors M127 to M132 and current sources Is123 and Is124 make up the voltage conversion circuit H12. The voltage conversion circuits H11 and H12 have essentially the same characteristics. Transistors M133 and M134 and a current source Is125 from the voltage-to-current converter G11, and transistors M135 and M136 the current-to-voltage converter R11. The current sources Is121 to Is125 are constant current sources.

Figure 16:
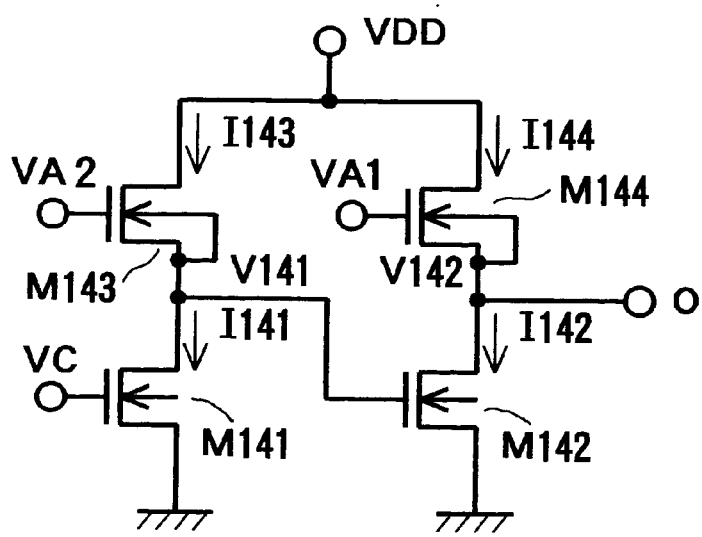
FIG. 16 is a circuit diagram showing the seventh example of the voltage conversion circuit used in the DDA according to the second embodiment.

FIG. 16 shows the seventh example of the voltage converter applicable to the second embodiment.

Referring to FIG. 16, n-channel MOS transistors M141 and M143 and n-channel MOS transistors M142 and M144 have essentially the same characteristics, respectively. The substrates of the transistors M143 and M144 are connected to their sources to eliminate the influence of the substrate bias effect. Each of the transistors M141 to M144 operates as a pentode.

The transistors M141 and M143 have essentially the same characteristics and are connected in series. For this reason, equal currents flow in these transistors, and they have equal gate-source voltages.

Therefore, $$V141=VA2-VC \tag{81}$$

The transistors M142 and M144 have essentially the same characteristics and are connected in series. For this reason, equal currents I142 and I144 flow in these transistors, and they have equal gate-source voltages.

Hence, $$VO-VC=VA1-VA2 \tag{82}$$

That is, the voltage between the output terminal and the reference voltage equals the input voltage.

Since each of the transistors M141 and M142 functions as a pentode, we have:

$$VA2 \geq 2VC-Vthn141 \tag{83}$$

$$VA1 \geq 2VA2 - 2VC - Vthn142 \tag{84}$$

$$VA2 \geq 2VC + Vthn141 \tag{85}$$

Assuming that Vthn141=Vthn142=Vthn, the variation range of the input voltage of the circuit shown in FIG. 16 is calculated using expressions (83), (84), and (85). The resultant variation range is shown in FIG. 17.

Figure 17:
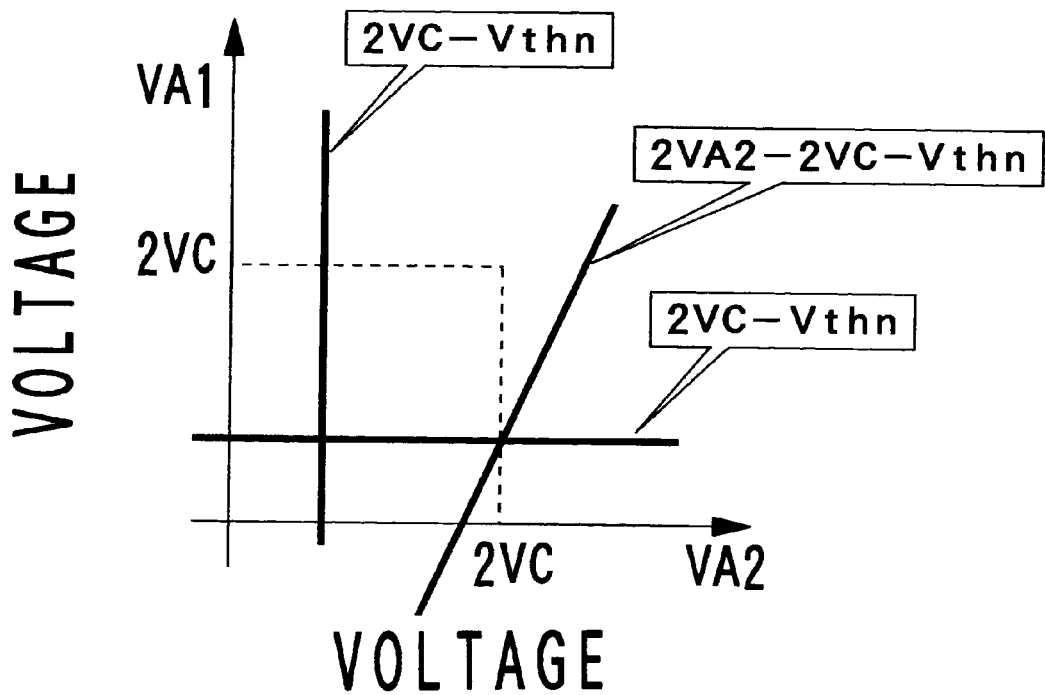
FIG. 17 is a graph showing the input voltage range of the voltage conversion circuit shown in FIG. 16.

As is apparent from FIG. 17, as the reference voltage VC becomes high, the variation ranges of the input voltages VA1 and VA2 also become large, and the maximum value of the input voltage amplitude always equals Vthn.

The circuit shown in FIG. 16 has a very simple arrangement and accurately operates at a high speed. When this circuit is used in the DDA according to the second embodiment, the DDA can be built using a small number of devices.

Figure 18:
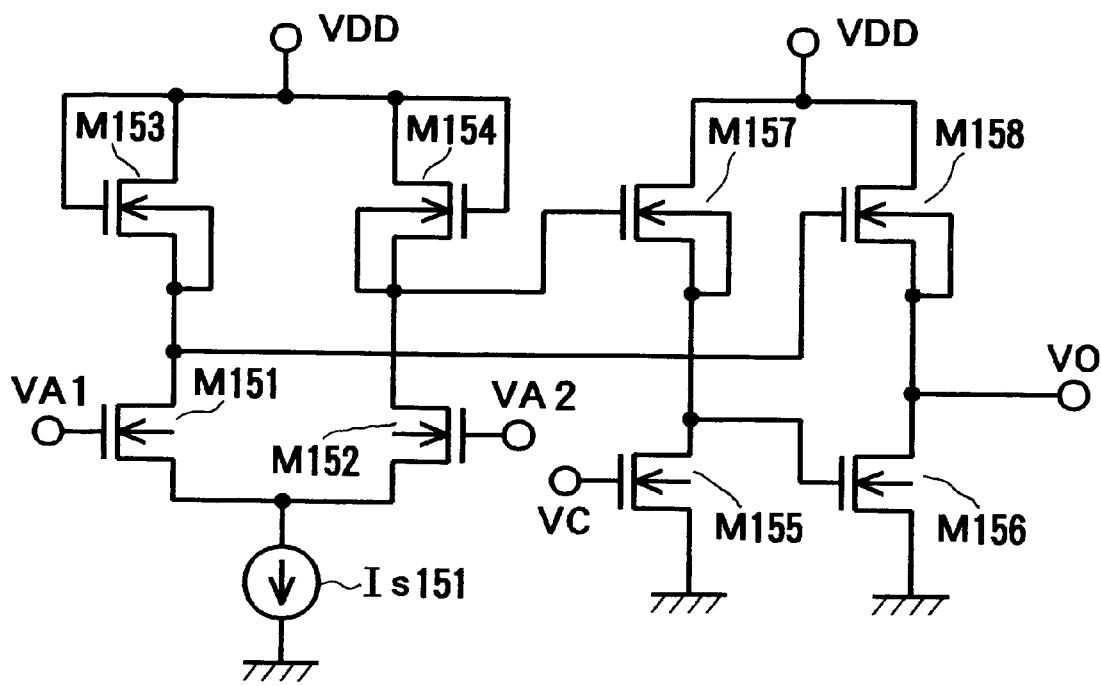
FIG. 18 is a circuit diagram showing the eighth example of the voltage conversion circuit used in the DDA according to the second embodiment.

In the circuit shown in FIG. 18, the input voltage of the circuit shown in FIG. 16 is supplied through the voltage converter shown in FIG. 2, thereby widening the variation range of the input voltage.

Transistors M151 and M152, transistors M153 and M154, transistors M155 and M157, and transistors M156 and M158 have essentially the same characteristics, respectively. In addition, the transistors M155 to M158 have essentially the same threshold voltage.

The output voltage is given by:

$$VO - VC = \frac{\sqrt{Kn151}}{\sqrt{Kn153}}(VA1 - VA2) \tag{86}$$

Figure 19:
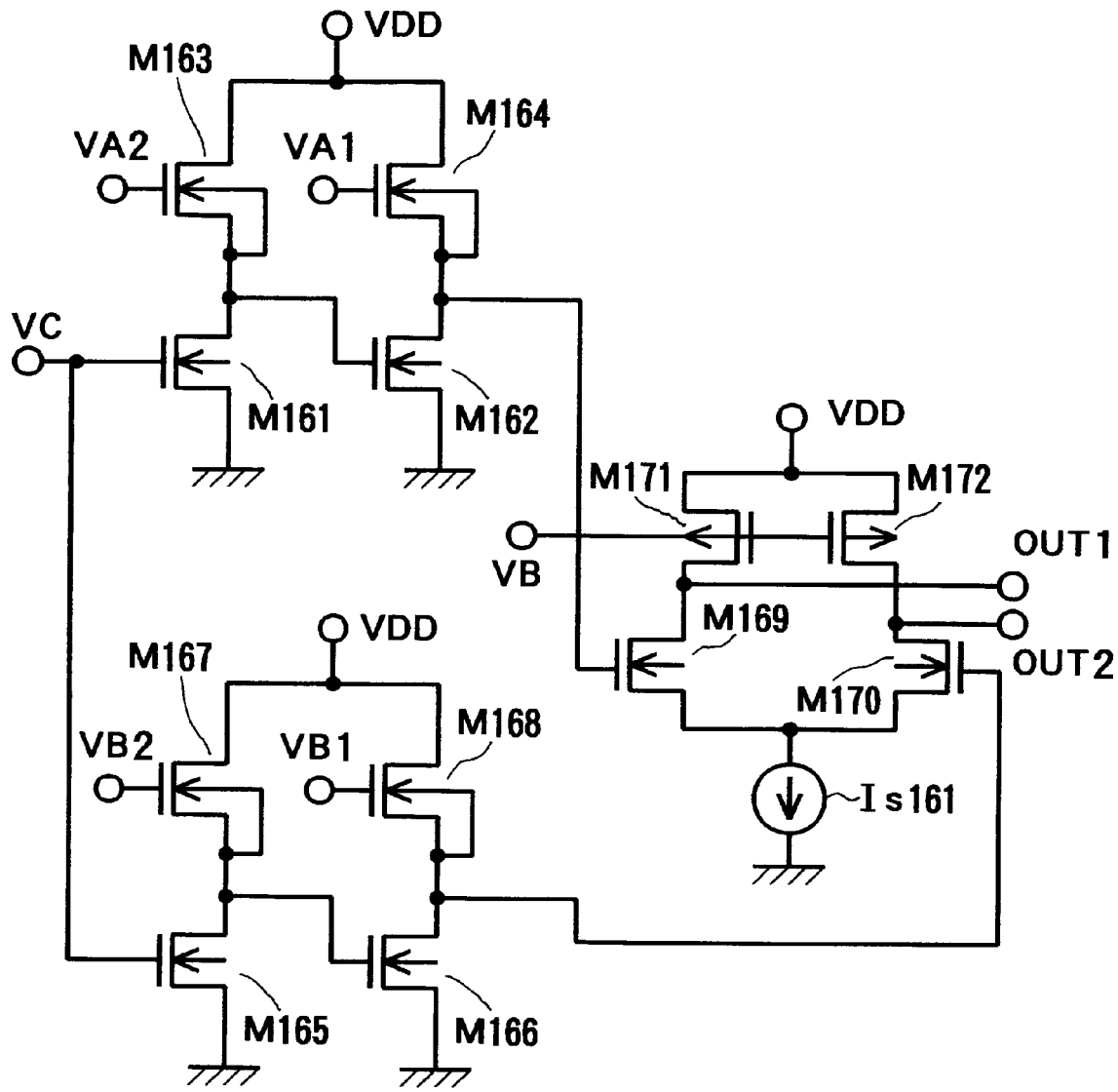
FIG. 19 is a circuit diagram showing the circuit arrangement of a DDA using the voltage conversion circuit shown in FIG. 16.
Figure 20:
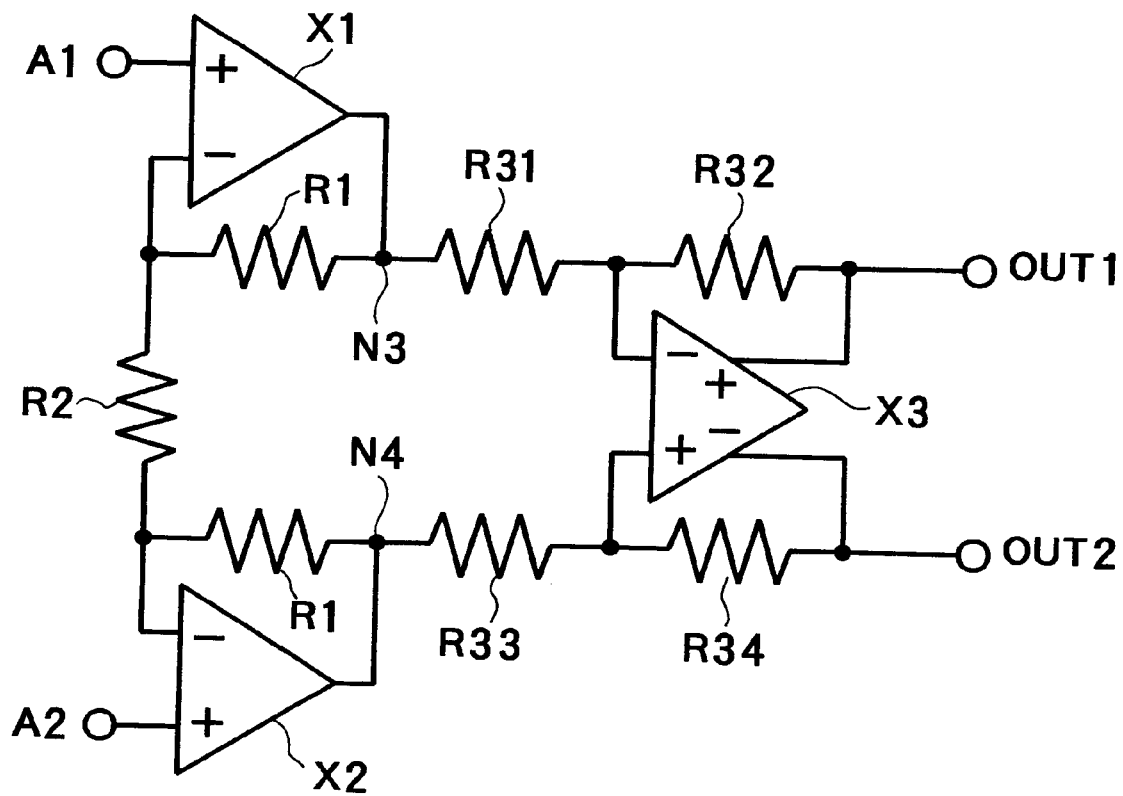
FIG. 20 is a circuit diagram showing the arrangement of a conventional instrumentation amplifier.
Figure 21:
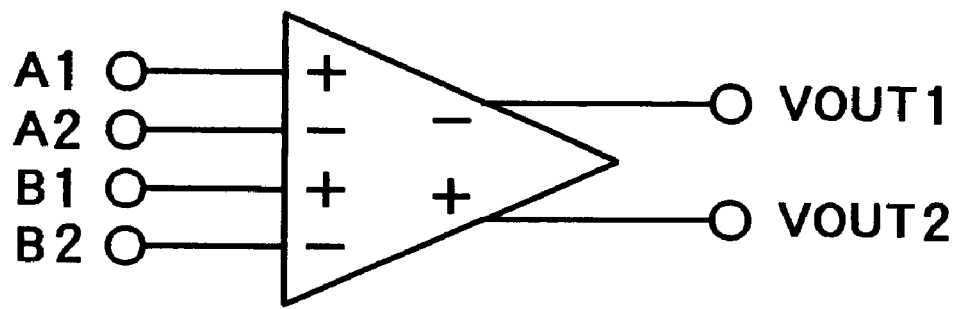
FIG. 21 is an explanatory view of the symbol of a DDA.
Figure 22:
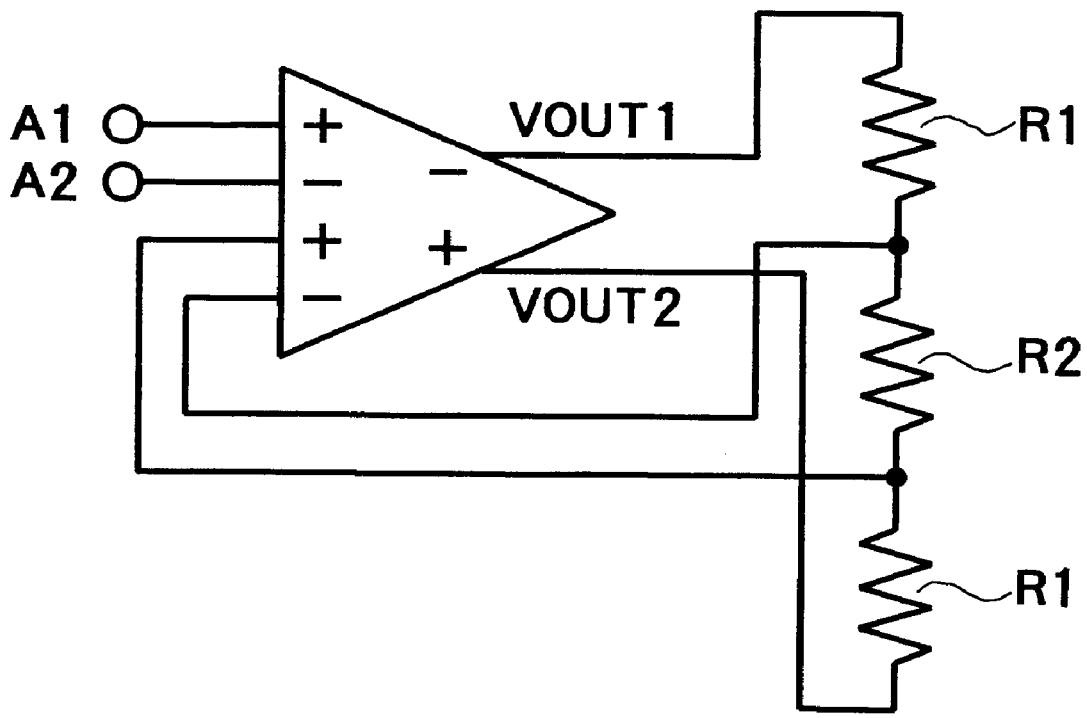
FIG. 22 is a circuit diagram showing the arrangement of an instrumentation amplifier using a DDA.
Figure 23:
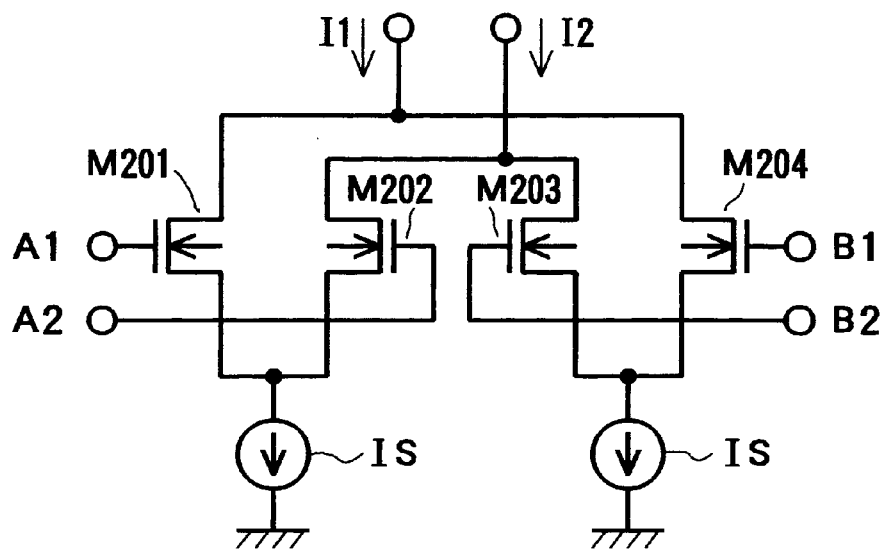
FIG. 23 is a circuit diagram showing the arrangement of a conventional DDA.
Figure 24:
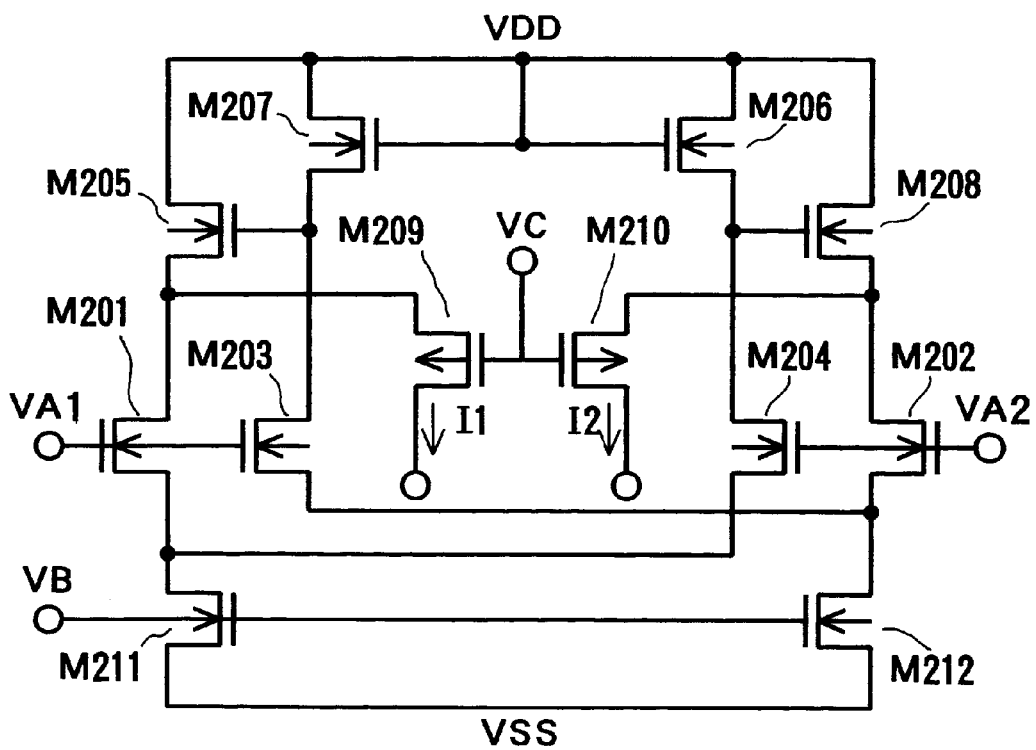
FIG. 24 is a circuit diagram showing the arrangement of another conventional DDA.

FIG. 19 shows the arrangement of a DDA using the single output voltage converter shown in FIG. 16.

Transistors M161 to M164 make up the first voltage conversion circuit, transistors M165 to M168 form the second voltage conversion circuit, and transistors M169 to M172 and a current source 161 form a voltage amplifier. The DDA may have this arrangement.

What is claimed is:

1. A voltage conversion circuit comprising:

first and second MOS transistors of a first conductivity type which have sources commonly connected and grounded through a constant current source and substantially the same characteristics;

a third MOS transistor of a second conductivity type which has a drain and gate connected to a drain of said first MOS transistor and a source connected to a power supply terminal;

a fourth MOS transistor of the second conductivity type which has a drain and gate connected to a drain of said second MOS transistor, a source connected to said power supply terminal, and substantially the same characteristics as those of said third MOS transistor;

a fifth MOS transistor of the first conductivity type which has a source connected to a reference power supply terminal and a gate connected to a drain thereof;

a sixth MOS transistor of the first conductivity type which has a source connected to said reference power supply terminal, a gate connected to a drain thereof, and substantially the same characteristics as those of said fifth MOS transistor;

a seventh MOS transistor of the second conductivity type which has a source connected to a power supply terminal, a drain connected to said drain of said fifth MOS transistor, and a gate connected to said gate of said third MOS transistor; and an eighth MOS transistor of the second conductivity type which has a source connected to said power supply terminal, a drain connected to said drain of said sixth MOS transistor, a gate connected to said gate of said fourth MOS transistor, and substantially the same characteristics as those of said seventh MOS transistor, wherein differential input voltages are applied to said gates of said first and second MOS transistors and differential voltages are output from said drains of said fifth and sixth MOS transistors.

2. A voltage conversion circuit comprising:

first and second MOS transistors of a first conductivity type which have sources commonly connected and grounded through a constant current source and substantially the same characteristics;

a third MOS transistor of a second conductivity type which has a drain and gate connected to a drain of said first MOS transistor and a source connected to a power supply terminal;

a fourth MOS transistor which has a drain and gate connected to a drain of said second MOS transistor, a source connected to said power supply terminal, and substantially the same characteristics as those of said third MOS transistor;

a fifth MOS transistor of the first conductivity type which has a source connected to a reference power supply terminal;

a sixth MOS transistor which has a source connected to said reference power supply terminal and substantially the same characteristics as those of said fifth MOS transistor;

a seventh MOS transistor of the second conductivity type which has a source connected to a power supply terminal, a drain connected to a drain of said fifth MOS transistor, and a gate connected to said gate of said third MOS transistor;

an eighth MOS transistor of the second conductivity type which has a source connected to said power supply terminal, a drain connected to a drain of said sixth MOS transistor, a gate connected to said gate of said fourth MOS transistor, and substantially the same characteristics as those of said seventh MOS transistor;

a first operational amplifier which has an inverting input terminal connected to said drain of said third MOS transistor, a noninverting input terminal connected to said drain of said seventh MOS transistor, and an output terminal connected to a gate of said fifth MOS transistor; and a second operational amplifier which has an inverting input terminal connected to said drain of said fourth MOS transistor, a noninverting input terminal connected to said drain of said eighth MOS transistor, and an output terminal connected to a gate of said sixth MOS transistor, wherein differential input voltages are applied to said gates of said first and second MOS transistors and differential voltages are output from said outputs of said first and second operational amplifiers.

3. A voltage conversion circuit comprising:

first and second MOS transistors of a first conductivity type which have sources commonly connected and grounded through a constant current source and substantially the same characteristics;

a third MOS transistor of the first conductivity type which has a source connected to a drain of said first MOS transistor and a drain connected to a power supply terminal;

a fourth MOS transistor of the first conductivity type which has a source connected to a drain of said second MOS transistor, a drain connected to said power supply terminal, and has substantially the same characteristics as those of said third MOS transistor; and an operational amplifier which has an inverting input terminal connected to said drain of said second MOS transistor, a noninverting input terminal connected to a reference voltage terminal, and an output terminal connected to gates of said third and fourth MOS transistors, wherein differential input voltages are applied to gates of said first and second MOS transistors, and a voltage across said drain of said first MOS transistor and said reference voltage terminal is output as an output voltage.

4. A voltage conversion circuit comprising:

first and second MOS transistors of a first conductivity type which have sources commonly connected and grounded through a constant current source and substantially the same characteristics;

a third MOS transistor of a second conductivity type which has a drain and gate connected to a drain of said first MOS transistor;

a fourth MOS transistor of the second conductivity type which has a drain and gate connected to a drain of said second MOS transistor and substantially the same characteristics as those of said third MOS transistor;

a fifth MOS transistor of the second conductivity type which has a drain commonly connected to sources of said third and fourth MOS transistors and a source connected to a power supply terminal; and an operational amplifier which has an inverting input terminal connected to said drain of said second MOS transistor, a noninverting input terminal connected to a reference voltage terminal, and an output terminal connected to a gate of said fifth MOS transistor, wherein differential input voltages are applied to gates of said first and second MOS transistors, and a voltage across said drain of said first MOS transistor and said reference voltage terminal is output as an output voltage.

5. A voltage conversion circuit comprising:

first and second MOS transistors of a first conductivity type which have sources commonly connected and grounded through a constant current source and substantially the same characteristics;

a third MOS transistor of a second conductivity type which have a drain and gate connected to a drain of said first MOS transistor and a source connected to a power supply terminal;

a fourth MOS transistor of the second conductivity type which has a drain and gate connected to a drain of said second MOS transistor, a source connected to said power supply terminal, and substantially the same characteristics as those of said third MOS transistor;

fifth and sixth MOS transistors of the first conductivity type which have sources commonly connected and substantially the same characteristics;

a seventh MOS transistor of the second conductivity type which has a source connected to a power supply terminal, a drain connected to a drain and gate of said fifth MOS transistor, and a gate connected to said gate of said third MOS transistor;

an eighth MOS transistor which has a source connected to said power supply terminal, a drain connected to a drain and gate of said sixth MOS transistor, a gate connected to said gate of said fourth MOS transistor, and substantially the same characteristics as those of said seventh MOS transistor;

a ninth MOS transistor of the first conductivity type which has a drain connected to said sources of said fifth and sixth MOS transistors and a source grounded; and a first operational amplifier which has a noninverting input terminal connected to said drain of said sixth MOS transistor, an inverting input terminal connected to a reference voltage terminal, and an output terminal connected to a gate of said ninth MOS transistor, wherein first or second differential input voltages are applied to gates of said first and second MOS transistors, and a voltage across a drain of said fifth MOS transistor and said reference voltage terminal is output as an output voltage.

6. A voltage conversion circuit comprising:

first and second MOS transistors of a first conductivity type which have sources commonly connected and grounded through a constant current source and substantially the same characteristics;

a third MOS transistor of a second conductivity type which have a drain and gate connected to a drain of said first MOS transistor and a source connected to a power supply terminal;

a fourth MOS transistor of the second conductivity type which has a drain and gate connected to a drain of said second MOS transistor, a source connected to said power supply terminal, and substantially the same characteristics as those of said third MOS transistor;

fifth and sixth MOS transistors of the first conductivity type which have sources commonly connected and substantially the same characteristics;

a seventh MOS transistor of the second conductivity type which has a source connected to a power supply terminal, a drain connected to a drain of said fifth MOS transistor, and a gate connected to said gate of said third MOS transistor;

an eighth MOS transistor of the second conductivity type which has a source connected to said power supply terminal, a drain connected to a drain of said sixth MOS transistor, a gate connected to said gate of said fourth MOS transistor, and substantially the same characteristics as those of said seventh MOS transistor;

a ninth MOS transistor of the first conductivity type which has a drain connected to said sources of said fifth and sixth MOS transistors and a source grounded;

a first operational amplifier which has an inverting input terminal connected to said drain of said third MOS transistor, a noninverting input terminal connected to said drain of said seventh MOS transistor, and an output terminal connected to a gate of said fifth MOS transistor;

a second operational amplifier which has an inverting input terminal connected to said drain of said fourth MOS transistor, a noninverting input terminal connected to said drain of said eighth MOS transistor, and an output terminal connected to a gate of said sixth MOS transistor; and a third operational amplifier which has a noninverting input terminal connected to said gate of said sixth MOS transistor, an inverting input terminal connected to a reference voltage terminal, and an output terminal connected to a gate of said ninth MOS transistor, wherein differential input voltages are applied to gates of said first and second MOS transistors, and a voltage across said gate of said fifth MOS transistor and said reference voltage terminal is output as an output voltage.

7. A voltage conversion circuit comprising:

first and second MOS transistors of a first conductivity type which have sources commonly connected and grounded through a first constant current source and substantially the same characteristics;

a third MOS transistor of a second conductivity type which has a drain and a gate connected to a drain of said first MOS transistor and a source connected to a power supply terminal;

fourth and fifth MOS transistors of the first conductivity type which have sources commonly connected and grounded through a second constant current source having substantially the same characteristics as those of said first constant current source, and substantially the same characteristics; and a sixth MOS transistor which has a source connected to a power supply terminal, a drain connected to a drain and gate of said fourth MOS transistor, a gate connected to said gate of said third MOS transistor, and substantially the same characteristics as those of said third MOS transistor, wherein a drain of said second MOS transistor is connected to a power supply terminal, a drain of said fifth MOS transistor is connected to a power supply terminal, and a gate of said fifth MOS transistor is connected to a reference voltage terminal, and differential input voltages are applied to gates of said first and second MOS transistors, and a voltage across gates of said fourth and fifth MOS transistors is output as an output voltage.

8. A voltage conversion circuit comprising:

first and second MOS transistors of a first conductivity type which have sources commonly connected and grounded through a first constant current source, and substantially the same characteristics;

a third MOS transistor of a second conductivity type which has a drain and gate connected to a drain of said first MOS transistor and a source connected to a power supply terminal;

fourth and fifth MOS transistors of the first conductivity type which have sources commonly connected and grounded through a second constant current source having substantially the same characteristics as those of said first constant current source, and substantially the same characteristics;

a sixth MOS transistor which has a source connected to a power supply terminal, a drain connected to a drain of said fourth MOS transistor, a gate connected to said gate of said third MOS transistor, and substantially the same characteristics as those of said third MOS transistor; and a first operational amplifier which has an inverting input terminal connected to said drain of said third MOS transistor, a noninverting input terminal connected to said drain of said sixth MOS transistor, and an output terminal connected to said gate of said fourth MOS transistor, wherein a drain of said second MOS transistor is connected to a power supply terminal, a drain of said fifth MOS transistor is connected to a power supply terminal, and a gate of said fifth MOS transistor is connected to a reference voltage terminal, and differential input voltages are applied to gates of said first and second MOS transistors, and a voltage across gates of said fourth and fifth MOS transistors is output as an output voltage.

9. A voltage conversion circuit comprising:

a first MOS transistor which has a source grounded and a gate connected to a reference voltage terminal;

a second MOS transistor which has a source connected to a drain of said first MOS transistor, a drain connected to a power supply terminal, and substantially the same characteristics as those of said first MOS transistor;

a third MOS transistor which has a source grounded, and a gate connected to said drain of said first MOS transistor; and a fourth MOS transistor which has a source connected to a drain of said third MOS transistor, a drain connected to said power supply terminal, and substantially the same characteristics as those of said third MOS transistor, wherein differential input voltages are applied across gates of said second and fourth MOS transistors, and a voltage between said drain of said third MOS transistor and said reference voltage terminal is output as an output voltage.

* * * * *